United States Patent [19]
Shimizu

[11] Patent Number: 5,932,906
[45] Date of Patent: *Aug. 3, 1999

[54] DRAM SEMICONDUCTOR DEVICE

[75] Inventor: Masahiro Shimizu, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/673,245

[22] Filed: Jun. 27, 1996

[30]     Foreign Application Priority Data

Jun. 28, 1995  [JP]  Japan ................................. 7-162317

[51] Int. Cl.⁶ .................. H01L 27/108; H01L 29/76; H01L 29/94; H01L 31/119
[52] U.S. Cl. .................. 257/306; 257/307; 257/309; 257/408; 257/296; 365/174; 365/182; 438/210; 438/232
[58] Field of Search ...................... 257/303, 306, 257/308, 307, 309, 336, 408; 365/149, 174, 182; 438/210, 232

[56]                 References Cited

U.S. PATENT DOCUMENTS

| 4,172,260 | 10/1979 | Okabe et al. | 257/408 |
|---|---|---|---|
| 5,126,278 | 6/1992 | Kodaira | 437/24 |
| 5,208,470 | 5/1993 | Lee et al. | 257/296 |
| 5,248,891 | 9/1993 | Takato et al. | 257/309 |
| 5,250,832 | 10/1993 | Murai | 257/306 |
| 5,285,092 | 2/1994 | Yoneda | 257/306 |
| 5,323,343 | 6/1994 | Ogoh et al. | 365/149 |
| 5,324,680 | 6/1994 | Lee et al. | |
| 5,386,131 | 1/1995 | Sato | |
| 5,451,807 | 9/1995 | Fujita | 257/404 |

FOREIGN PATENT DOCUMENTS

| 41 29 130 A1 | 9/1992 | Germany . |
|---|---|---|
| 55-123171 | 9/1980 | Japan . |
| 2-133953 | 5/1990 | Japan . |
| 2-143456 | 6/1990 | Japan . |
| 3-49259 | 3/1991 | Japan . |
| 3-165557 | 7/1991 | Japan . |
| 3-204969 | 9/1991 | Japan . |
| 3-220774 | 9/1991 | Japan . |
| 4-208571 | 7/1992 | Japan . |
| 4-211162 | 8/1992 | Japan . |

*Primary Examiner*—Mahshid Saadat
*Assistant Examiner*—Allan R. Wilson
*Attorney, Agent, or Firm*—McDermott, Will & Emery

[57]                 ABSTRACT

A semiconductor device is provided in which conjunction leakage current from a conductive layer to a semiconductor substrate is restrained and the electric field in the vicinity of a region immediately below a gate electrode is relieved. The device includes $n^+$ and $n^{++}$ impurity diffusion layers electrically connected with a columnar conductive layer at a contact portion. The distance L4 from contact portion to $n^+$ impurity diffusion layer, the distance L5 from $n^{++}$ impurity diffusion layer to a source/drain region, and the distance L6 from $n^+$ impurity diffusion layer to the region immediately below the side surface of gate electrode are approximately the same, and columnar conductive layer and gate electrode are formed close to each other to such a degree that their distance L7 is almost the same as the distance L2 from the surface of semiconductor substrate to the top surface of gate electrode.

13 Claims, 25 Drawing Sheets

5,932,906

DRAM SEMICONDUCTOR DEVICE

BACKGROUND OF THE INVENTION

1. Field of the Invention

The present invention relates to a semiconductor device, and more particularly, to a semiconductor device such as a dynamic random access memory (hereinafter referred to as DRAM) capable of stable operation.

2. Description of the Background Art

In recent years, demands for semiconductor devices have rapidly increased as information appliances remarkably come into wide use. From the functional point of view, devices with greater storage capacity and higher operation speed are in demand. Technological development of semiconductor devices having higher integration density, responsiveness and reliability is in progress to meet such demand.

A DRAM is a semiconductor memory device which permits random input/output of storage information. In general, the DRAM includes a memory cell array which is a storage region for storing a large amount of storage information, and peripheral circuitry necessary for inputting/outputting information to/from outside the device.

FIG. 34 is a block diagram showing the configuration of a general DRAM. Referring to FIG. 34, DRAM 50 includes a memory cell array 51 for storing data signals indicating storage information, a row and column address buffer 52 receiving an externally applied address signal used to select a memory cell which constitutes a unit storage circuit, a row decoder 53 and a column decoder 54 for decoding the address signal and designating the memory cell, a sense refresh amplifier 55 for amplifying a signal stored in the designated memory cell for reading, a data in buffer 56 and a data out buffer 57 for inputting/outputting data, and a clock generator 58 for generating a clock signal. Memory cell array 51 which occupies a large area on the semiconductor chip has a plurality of memory cells arranged in a matrix for storing unit storage information.

FIG. 35 is a diagram showing memory cells for 4 bits in the memory cell array. In FIG. 35, a memory cell includes a MOS (Metal Oxide Semiconductor) transistor, and a capacitor 16 having one electrode connected to MOS transistor 15, and is connected to a bit line 14 and a word line 17. Information is stored in capacitor 16 as charge. One memory cell shown is a so-called one-transistor-one-capacitor-type memory cell formed of one MOS transistor 15 and one capacitor 16 connected thereto. For its simple structure, this type of memory cell allows for improvement of the integration density of memory cell array, and is therefore in wide use in DRAMs which require large storage capacities.

In order to achieve greater storage capacities, the efforts to improve the integration density of a memory cell array has been made by changing the structures of elements such as a capacitor in a memory cell. The DRAM memory cells can be classified into several types depending on the structures of their capacitors. One type of memory cell, a stacked type memory cell will be detailed.

FIG. 36 is a plan view showing the structure of a conventional stacked type memory cell. FIG. 37 is a cross sectional view taken along line A—A in FIG. 36. Referring to FIGS. 36 and 37, the memory cell includes a p type region 151 in a semiconductor substrate 150, a gate insulating film 152, a field insulating film 153, a gate electrode 154 formed of part of a word line, a storage node 155 formed of polysilicon, a capacitor insulating film 156, a cell plate 157 formed of polysilicon, an interlayer insulating film 162, and a pair of n type source/drain regions 158a and 158b. One memory cell is formed of one MOS transistor and one capacitor isolated from each other by an interlayer insulating film. The MOS transistor includes n type source/drain region pair 158 and gate electrode 154. A capacitor 180 is formed of storage node 155 and cell plate 157 with capacitor insulating film 156 interposed therebetween. The storage node 155 of capacitor 180 is connected to the surface of n type source/drain region 158a of the MOS transistor through a columnar conductive layer 155a formed in interlayer insulating film 162.

Now, a method of forming such a stacked type memory cell will be described. Referring to FIG. 38, gate insulating film 152 and gate electrode 154 having a prescribed width are formed in a region isolated by a p type impurity region 166 and field insulating film 153 on semiconductor substrate 150 having p type region 151. The pair of n type source/drain regions 158a and 158b are then formed, for example, by means of ion implantation, thus completing the MOS transistor. Referring to FIG. 39, an interlayer insulating film 160 is formed on semiconductor substrate 150 so as to cover the MOS transistor. A contact hole 161 for a bit line is formed in interlayer insulating film 160 to expose a contact portion 201 including part of the surface of n type source/drain region 158b. Referring to FIG. 40, a bit line 159 to be connected to part of the surface of n type source/drain region 158b at contact portion 201 is formed. Referring to FIG. 41, interlayer insulating film 162 is then formed over bit line 159. A contact hole 163 for a storage node is formed in interlayer insulating film 162 to expose contact portion 200 including part of the surface of n type source/drain region 158a. Referring to FIG. 42, a columnar conductive layer 155a to be electrically connected to n type source/drain region 158a at contact portion 200 is formed in contact hole 163 for storage node. Storage node 155 to be electrically connected to columnar conductive layer 155a is formed. Referring to FIG. 43, cell plate 157 is formed on storage node 155 with capacitor insulating film 156 interposed therebetween. Interlayer insulating film 164, a metal interconnection 165 and other elements are formed on cell plate 157. A conventional stacked type memory cell is formed as described above.

In the above process of manufacturing, some patterns are not accurately photolithographed on the semiconductor substrate, resulting in pattern mismatch in the surface of the semiconductor substrate at a certain frequency. This is so-called misalignment, and this has been more often encountered as the device size has shrunk in recent years.

In the process of manufacturing, if a conventional stacked type memory cell has misalignment in a contact for storage node in particular, part of field insulating film 153 is sometimes removed as shown in FIG. 44. In such a case, part of columnar conductive layer 155a connected to storage node 155 of the capacitor comes into direct contact with p type region 151 at point A as shown in FIG. 44 without the interposition of n type source/region 158a.

In the vicinity of a junction between n type source/drain region 158a and p type region 151, electrons, i.e., carriers in the n type region, and holes, i.e., carriers in the p type region are recombined to form a depletion layer having a low carrier concentration, thereby electrically isolating conductive layer 155a and p type region 151. At point A without this depletion layer, however, columnar conductive layer 155a is electrically connected to the p type region 151 of the semiconductor substrate. The flow of charges stored at storage node 155 to p type region 151 through columnar conductive layer 155*a*, in other words junction leakage current increases, and the held data may be destroyed.

A p type impurity region 166 having an impurity concentration higher than the concentration of a p type impurity contained in the semiconductor substrate is formed under field insulating film 153 in order to enhance element isolation, and therefore, as columnar conductive layer 155*a* comes close to p type impurity region 166, the electric field tends to be intensified, further increasing the junction leakage current.

As stated above, the semiconductor devices with higher integration densities are in demand to cope with larger memory capacities required. In such an environment, for example in FIG. 37, the distance between columnar conductive layer 155*a* and gate electrode 154 or the distance between bit line 159 and gate electrode 154 is shrinking.

Thus, the electric field around the region under gate electrode 154 increases, and the MOS transistor may cause a short channel effect which sometimes impedes the semiconductor device from performing predetermined operations.

As described above, in a conventional stacked type memory cell structure, the problem associated with misalignment resulting from the shrinkage of device prevails, and particularly as for alignment in a contact for storage node, charges stored at the storage node flow to the semiconductor substrate, in other words junction leakage current increases, and held data is destroyed.

In association with increase in the integration density of semiconductor devices, the distance between a conductive layer having a capacitor connected therewith and a gate electrode shrinks, which intensifies the electric field around the region under the gate electrode, and the MOS transistor is sometimes encountered with a short channel effect. As a result, the semiconductor device sometimes does not perform semiconductor device sometimes does not perform predetermined operation.

SUMMARY OF THE INVENTION

It is therefore an object of the present invention to provide a highly reliable semiconductor device having a high storage characteristic and capable of stable operation which restrains leakage of junction current from the capacitor to the semiconductor substrate, and relieves the electric field under the gate electrode.

In order to achieve the above-described object, a semiconductor device according to a first aspect of the present invention includes a region of first type conductivity, a pair of first impurity regions of second type conductivity, a gate electrode, a first insulating film, a second insulating film, a contact hole, a conductive layer, and a second impurity region of second type conductivity. The region of first type conductivity is formed on a main surface of the semiconductor substrate. The pair of first impurity regions of second type conductivity are formed in the region of first type conductivity a prescribed space apart from each other. The gate electrode is formed on the region of first type conductivity between the pair of first impurity regions with the first insulating film therebetween. The second insulating film is formed on the main surface so as to cover the gate electrode. The contact hole is formed in the second insulating film so as to expose a contact portion including part of the surface of at least one of the pair of first impurity regions. The conductive layer is formed to fill the contact hole, and electrically connected with the above one region at the contact portion. The second impurity region of second type conductivity is formed in the one region on the main surface to include the contact portion. The second impurity region has an impurity concentration of second type conductivity higher than that of first impurity region and formed at a deeper level than that one of the first impurity regions. The distance on the main surface from the second impurity region to the region immediately below the side surface of the gate electrode on the second impurity region side is longer than the distance from the main surface to the top surface of the gate electrode.

The structure includes the contact portion electrically connected with the conductive layer, and the second impurity region having the above-described positional relation, and a depletion layer is formed in the vicinity of the boundary between the region of first type conductivity of the semiconductor substrate and the second impurity region as a result. The depletion layer electrically isolates the conductive layer from the region of the first type conductivity. Current leakage from the conductive layer to the region of the first type conductivity through the contact portion can be prevented, thus providing a semiconductor device capable of stable operation.

Preferably, a third impurity region of the second type conductivity formed in the one region and surrounds the second impurity region on the main surface may additionally be provided. The third impurity region has a concentration of the impurity of second type conductivity higher than that of the first impurity region and lower than that of the second impurity region. The second impurity region, the third impurity region, and the one region are located in this order from the contact portion toward the gate electrode on the main surface.

In such a case, the concentration of the impurity of second type conductivity gradually decreases from the contact portion toward the vicinity of the region immediately below the side surface of the gate electrode. This relieves the electric field of the depletion layer, thus further restraining current leakage from the conductive layer toward the region of first type conductivity. Electric field in the vicinity of the region immediately below the gate electrode is also relieved, and the short channel effect of the MOS transistor having the gate electrode and the pair of first impurity regions can be restrained. Therefore, a highly reliable semiconductor device with high operation characteristic can be provided.

Preferably, the distance on the main surface from the third impurity region to the region immediately below the side surface of the gate electrode on the side of the third impurity region on the main surface may be approximately half the distance on the main surface from the second impurity region to the region immediately below the side surface.

In such a case, the boundary between the third impurity region and the first impurity region on the main surface lies approximately midway between the second impurity region and the region immediately below the side surface of the gate electrode. Therefore, the electric field is approximately uniformly relieved from the contact portion toward the vicinity of the region immediately below the side surface of the gate electrode, and the current leakage and the short channel effect of the MOS transistor can be restrained effectively. Thus, a highly reliable semiconductor device with high operation characteristic can be provided.

A semiconductor device according to a second aspect of the present invention includes a region of first type conductivity, a pair of first impurity regions of second type conductivity, a gate electrode, a first insulating film, a second insulating film, a contact hole, a conductive layer, a second impurity region of the second type conductivity, and a third impurity region of the second type conductivity. The region of first type conductivity is formed on a main surface of the semiconductor substrate. The pair of first impurity regions of second type conductivity are formed a prescribed space apart from each other in the first conductive region. The gate electrode is formed on the region of the first type conductivity between the pair of first impurity regions with the first insulating film therebetween. The second insulating film is formed on the main surface including the gate electrode. The contact hole is formed in the second insulating film so as to expose a contact portion including part of the surface of at least one of the pair of the first impurity regions. The conductive layer is formed to fill the contact hole, and electrically connected with the one of the first impurity regions at the contact portion. The second impurity region of second type conductivity is formed in the one region to includes the contact portion. The third impurity region of second type conductivity is formed in the one region to include the contact portion and surrounds the second impurity region in the main surface. The second impurity region has an impurity of the second type conductivity whose concentration is higher than that of the first impurity regions and formed at a deeper level than the one region. The third impurity region has an impurity of the second type conductivity whose concentration is higher than that of the first impurity region and lower than that of the second impurity region. The distance on the main surface from the contact portion to the region immediately below the side surface of the gate electrode on the side of contact portion is longer than the distance from the main surface to the top surface of the gate electrode. On the main surface, the second impurity region, the third impurity region, and the one region are formed in this order from the contact portion toward the gate electrode.

In this structure, if the distance between the conductive layer and the gate electrode becomes as short as the distance from the main surface to the top surface of the gate electrode according to high density integration of semiconductor devices, the concentration of impurity of second type conductivity gradually decreases from the contact portion connected with the conductive layer toward the region immediately below the side surface of the gate electrode. This relieves the electric field particularly in the vicinity of the region immediately below the side surface of the gate electrode, thereby restraining the short channel effect of the MOS transistor. The electric field of the depletion layer formed in the vicinity of the boundary between the region of first type conductivity and the second or third impurity region can also be relieved, and current leakage from the conductive layer to the region of the first type conductivity may be restrained as well. Therefore, in semiconductor devices directed to high density integration, a highly reliable semiconductor device with high operation characteristic can be provided.

Preferably, on the main surface, the distance from the contact portion to the third impurity region in the direction from the contact portion toward the gate electrode, the distance from the second impurity region to the one region, and the distance from the third impurity region from the region immediately below the side surface of gate electrode may approximately be the same.

In such a case, on the main surface, the boundary between the second impurity region and the third impurity region and the boundary between the third impurity region and the one region are located so as to divide the distance from the contact portion to the region immediately below the side surface of the gate electrode into three equal parts. Thus, the electric field from the contact portion to the vicinity of the region immediately below the side surface of the gate electrode is approximately uniformly relieved, and the short channel effect of MOS transistor can particularly effectively restrained. Therefore, a highly reliable semiconductor device with high operation characteristic can be provided.

More preferably, a capacitor electrically connected with the conductive layer may additionally be provided. The capacitor has a storage node, and a cell plate formed on the storage node with a capacitor insulating film therebetween.

In such a case, leakage of charges stored in the capacitor to the region of the first type conductivity of the semiconductor substrate can be restrained. Therefore, a highly reliable semiconductor device with good storage characteristic can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor device according to a first embodiment of the invention will be described in conjunction with the accompanying drawings.

Figure 1:
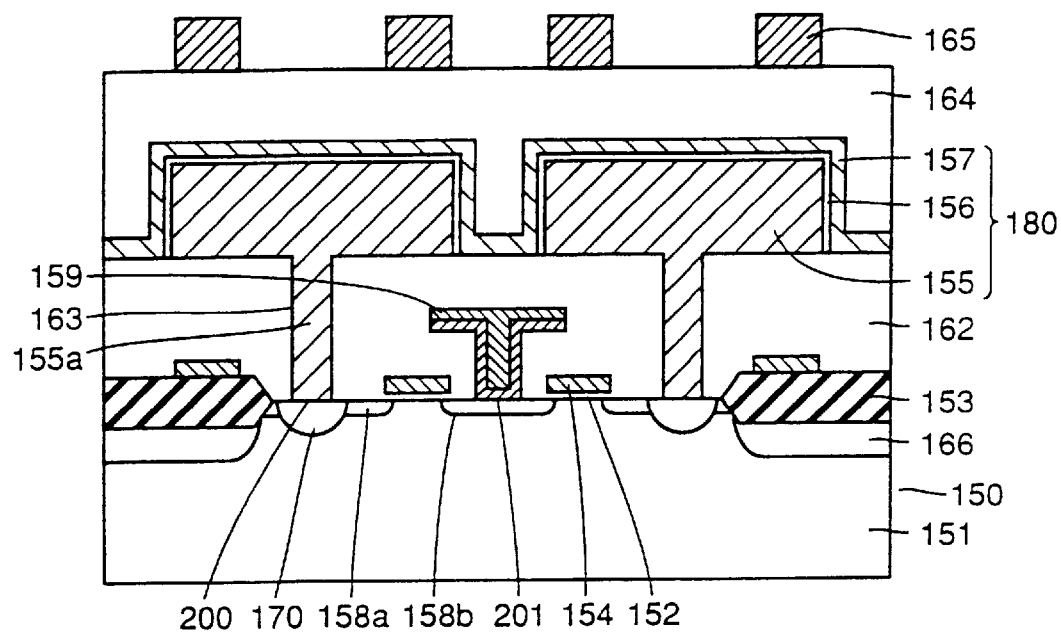
FIG. 1 is a view showing a cross section of a semiconductor device according to a first embodiment of the invention.

Referring to FIG. 1, the semiconductor device includes a MOS transistor having a gate electrode 154 formed on a p type region 151 in a main surface of a semiconductor substrate 150 with a gate insulating film 152 therebetween, and a pair of n type source/drain regions 158a, 158b extend from the vicinity immediately below the side wall of gate electrode 154 to the left and the right in FIG. 1, respectively. The MOS transistor is electrically isolated from other MOS transistors by the function of a field insulating film 153 and a p type impurity region 166.

Source/drain region 158a is electrically connected with a capacitor 180 at a contact portion 200 through a columnar conductive layer 155a. Capacitor 180 has a storage node 155, a capacitor insulating film 156, and a cell plate 157. An n$^+$ impurity diffusion layer 170 as the second impurity region according to the first aspect of the present invention is provided so as to include contact portion 200. Source/drain region 158b is electrically connected with a bit line 159 at a contact portion 201. A metal interconnection 165 is formed on cell plate 157 with an interlayer insulating film 164 therebetween.

Figure 2:
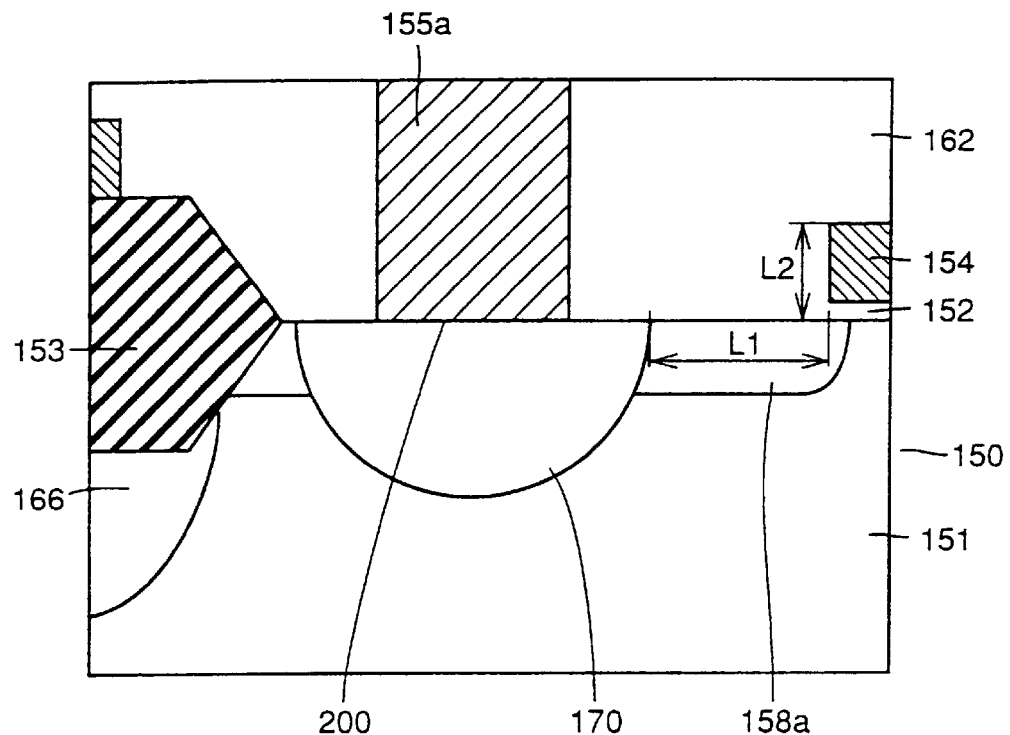
FIG. 2 is a view showing the cross section in FIG. 1 partially enlarged.

N$^+$ impurity diffusion layer 170 is formed by introducing an impurity from contact hole 163, and formed at a deeper level than source/drain region 158a. N$^+$ impurity diffusion layer 170 has an n type impurity concentration (e.g., $10^{17}$–$10^{20}$ atoms/cm$^3$) higher than the n type impurity concentration (e.g., $10^{16}$–$10^{19}$ atoms/cm$^3$) of source/drain region 158a. In addition, as illustrated in FIG. 2, the distance L1 from n$^+$ impurity diffusion layer 170 to the region immediately below the side surface of gate electrode 154 on semiconductor substrate 150 is longer than the distance from the surface of semiconductor substrate 150 to the top surface of gate electrode 154.

Figure 3:
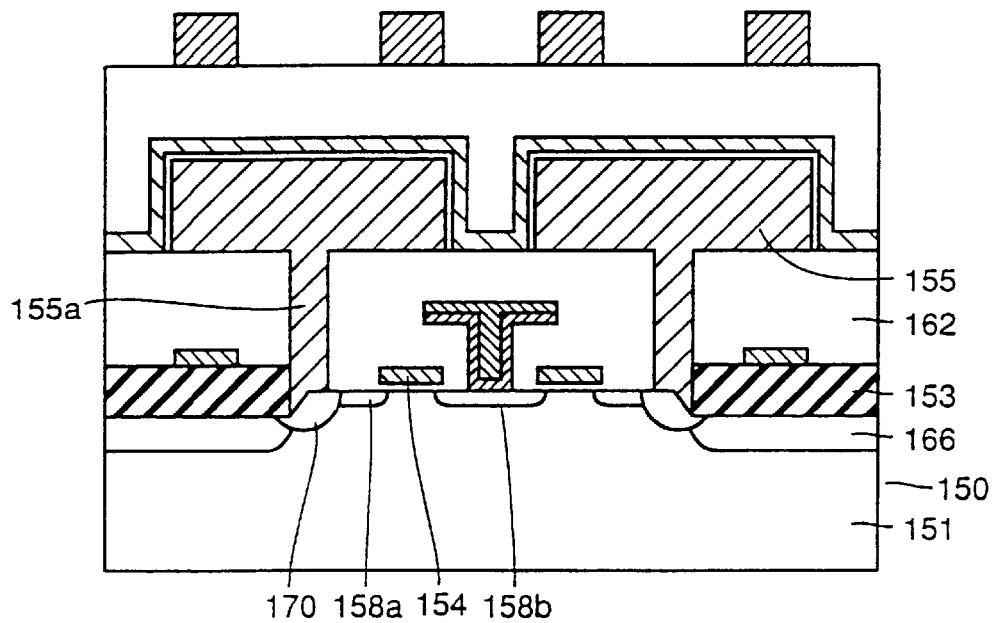
FIG. 3 is a view showing another cross section of the semiconductor device according to the first embodiment.

In this structure, if contact hole 163 into which columnar or conductive layer 155a is to be formed is with misalignment, n$^+$ impurity diffusion layer 170 is formed as illustrated in FIG. 3. A depletion layer is formed in the vicinity of the boundary between n$^+$ impurity diffusion layer 170 and p type region 151, thereby electrically isolating them. Therefore, leakage of charges stored at storage node 155, in other words junction leakage current toward p type region 151 can be prevented.

Second Embodiment

A semiconductor device according to a second embodiment of the invention will be described in conjunction with the accompanying drawings.

Figure 4:
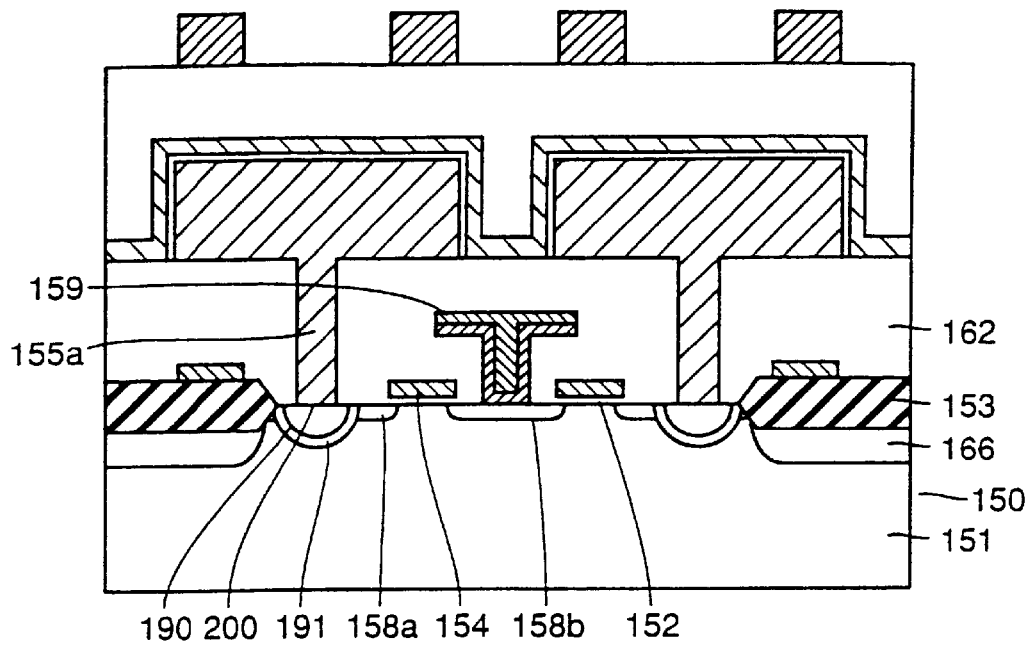
FIG. 4 is a view showing a cross section of a semiconductor device according to a second embodiment of the invention.

Referring to FIG. 4, the semiconductor device includes an n$^{++}$ impurity diffusion layer 190 as the second impurity region according to the first aspect of the invention, and an n$^+$ impurity diffusion layer 191 as the third impurity region. The distance on the semiconductor substrate 150 from n$^{++}$ impurity diffusion layer 190 to the region immediately below the side surface of gate electrode 154 is longer than the distance from the surface of semiconductor substrate 150 to the top surface of gate electrode 154. Note that the structure of the other elements is the same as the one described in conjunction with the first embodiment, and therefore is not further detailed here.

N$^{++}$ impurity diffusion layer 190 has a concentration (e.g., $10^{18}$–$10^{21}$ atoms/cm$^3$) higher than the impurity concentration of n$^+$ impurity diffusion layer 191. N$^{++}$ impurity diffusion layer 190 is formed at a deeper level than n$^+$ impurity diffusion layer 191. In the direction from contact portion 200 to gate electrode 154, n$^{++}$ impurity diffusion layer 190, n$^+$ impurity diffusion layer 191, and source/drain region 158a are located in this order.

In this structure, the n type impurity concentration has a gradient from the region in the vicinity of contact portion 200 connected with the storage node toward the vicinity of the region immediately below the side surface of the gate electrode 154, and therefore, the electric field in the vicinity of the region immediately below the side surface of gate electrode 154 is relieved. In addition to the effect of restraining junction leakage current described in conjunction with the first embodiment, the short channel effect of the MOS transistor can effectively be restrained.

Figure 5:
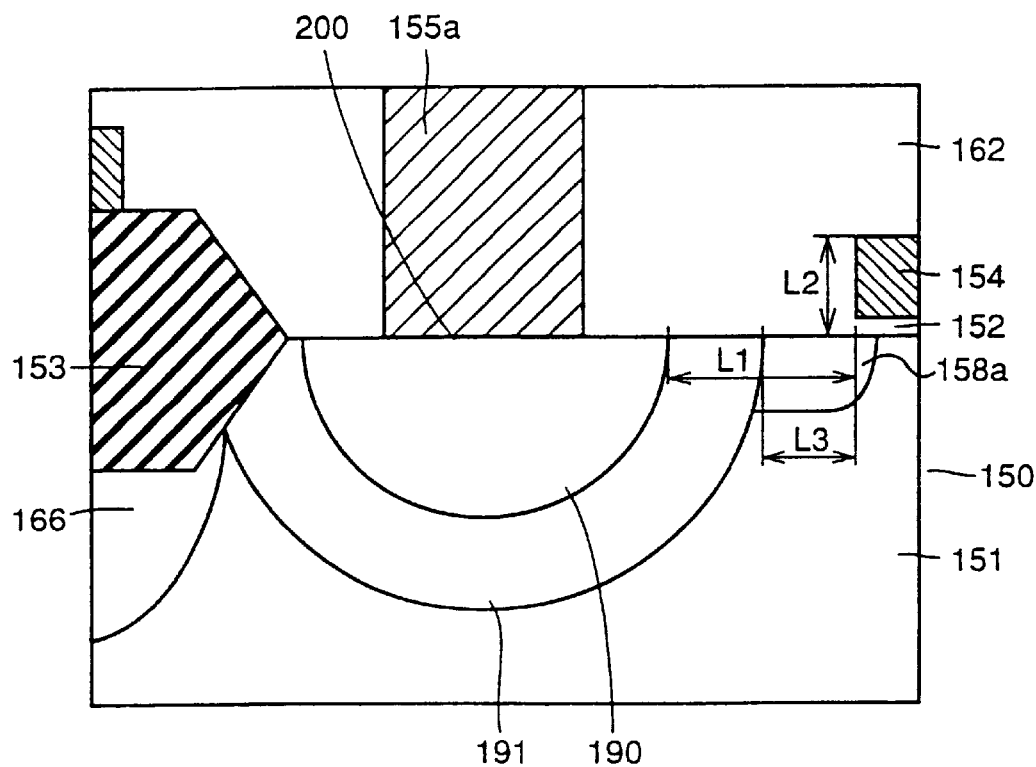
FIG. 5 is a view showing the cross section in FIG. 4 partially enlarged.

As illustrated in FIG. 5, the distance L3 on semiconductor substrate 150 from n$^+$ impurity diffusion layer 191 to the region immediately below the side surface of gate electrode 154 may be about half the distance L1 from n$^{++}$ impurity diffusion layer 190 to the region immediately below the side surface of gate electrode 154.

In the above case, the n type impurity concentration gradually decreases from n$^+$ impurity diffusion layer 190 toward source/drain region 158a in the vicinity of the region immediately below the surface of gate electrode 154, and therefore, the electric field is uniformly relieved. Therefore, the short channel effect of the transistor may further be restrained.

Figure 6:
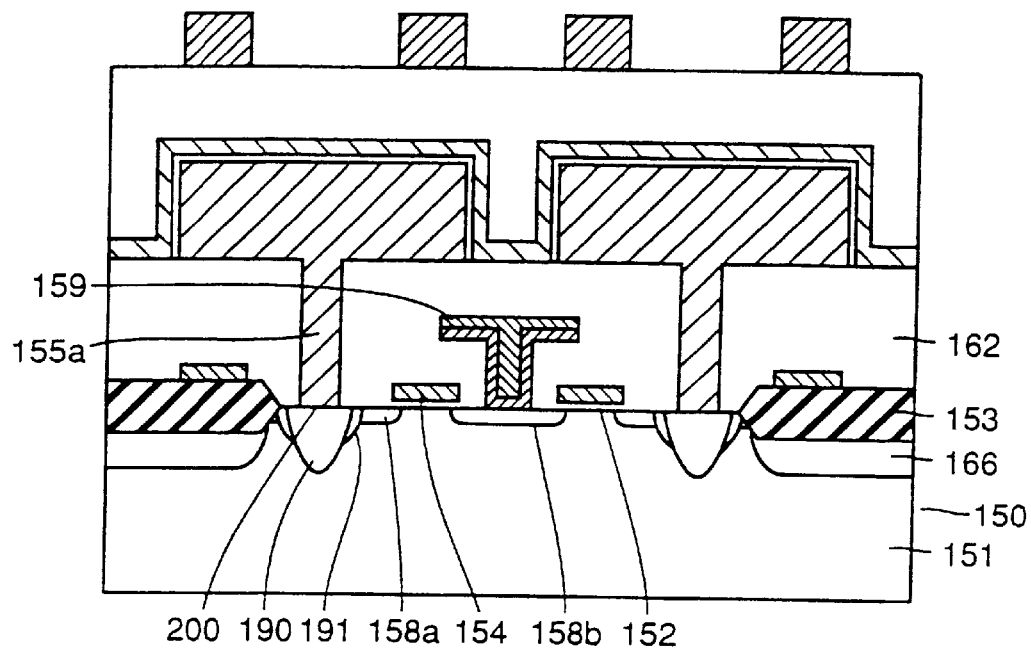
FIG. 6 is a view showing another cross section of the semiconductor device according to the second embodiment of the invention.
Figure 7:
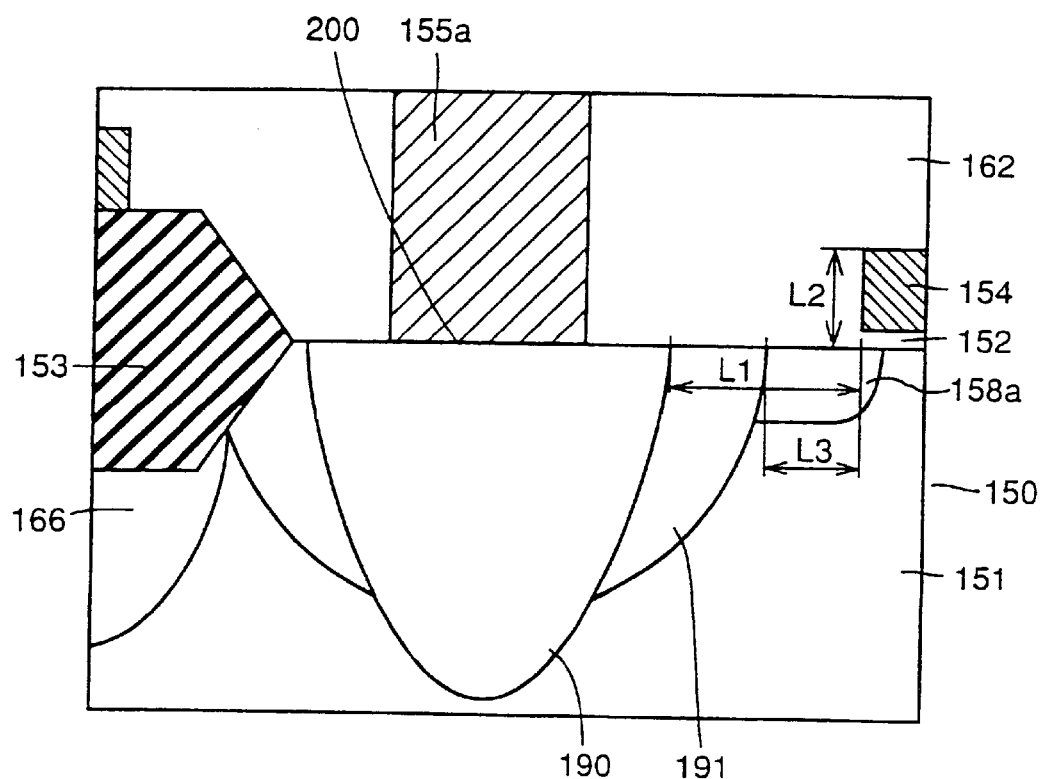
FIG. 7 is a view showing the cross section in FIG. 6 partially enlarged.

With $n^{++}$ impurity diffusion layer 190 being formed at a deeper level than $n^+$ impurity diffusion layer 191 as illustrated in FIG. 6, the above-described effects can be provided. In addition, if the distance L3 from $n^+$ impurity diffusion layer 191 to the region immediately below the side surface of gate electrode 154 is set about half distance L1 from $n^{++}$ impurity diffusion layer 190 to the region immediately below the side surface of gate electrode 154 as illustrated in FIG. 7, the effects can be enhanced.

Third Embodiment

Figure 8:
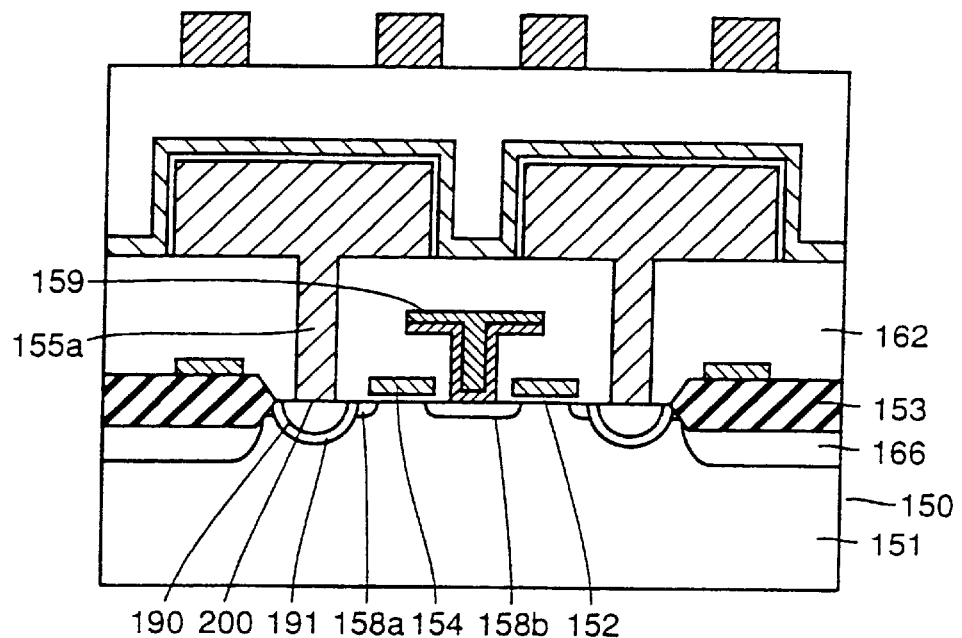
FIG. 8 is a view showing a cross section of a semiconductor device according to a third embodiment of the invention.

A semiconductor device according to a third embodiment of the invention will be described in conjunction with the accompanying drawings. Referring to FIG. 8, the semiconductor device includes an $n^{++}$ impurity diffusion layer 190 as the second impurity region according to the second aspect of the present invention, and an $n^+$ impurity diffusion layer 191 as the third impurity region. The distance on semiconductor substrate 150 from contact portion 200 to the region immediately below the side surface of gate electrodes 154 on the side of contact portion is longer than the distance from the surface of semiconductor substrate 150 to the top surface of gate electrode 154. In other words, gate electrode 154 and columnar conductive layer 155a are formed closer than the case described in conjunction with the second embodiment.

Figure 9:
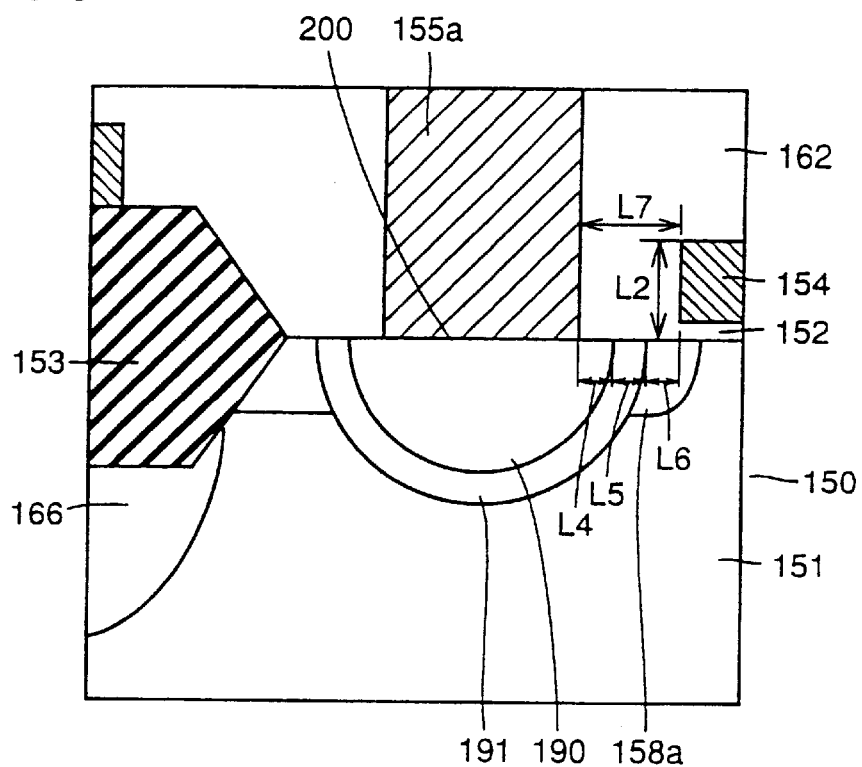
FIG. 9 is a view showing the cross section in FIG. 8 partially enlarged.

In the structure, as illustrated in FIG. 9, contact portion 200 and gate electrode 154 are close to each other to such a degree that the distance L7 from contact portion 200 to the region immediately below the side surface of gate electrode 154 is close to distance L2 from semiconductor substrate 150 to the top surface of gate electrode 154. On the surface of semiconductor substrate 150 from contact portion 200 to gate electrode 154, $n^{++}$ impurity diffusion layer 190, $n^+$ impurity diffusion 191, and source/drain region 158a are located in this order.

In this structure, the n type impurity concentration has a gradient from the vicinity of contact portion 200 connected with columnar conductive layer 155a toward the vicinity of the region immediately below the side surface of gate electrode 154, thereby relieving the electric field in the vicinity of the region immediately below the side surface of gate electrode 154. The short channel effect of the MOS transistor can therefore be restrained.

In addition, as illustrated in FIG. 9, the distance L4 from contact portion 200 to $n^+$ impurity diffusion layer 191, the distance L5 from $n^{++}$ impurity diffusion layer 190 to source/drain region 158a, and the distance L6 from $n^+$ impurity diffusion layer 191 to the region immediately below the side surface of gate electrode 154 may be the same.

In the above case, the electric field from the vicinity of contact portion 200 to the vicinity of the region immediately below the side surface of gate electrode 154 can uniformly be relieved. Therefore, the short channel effect of the transistor may further be restrained.

Figure 10:
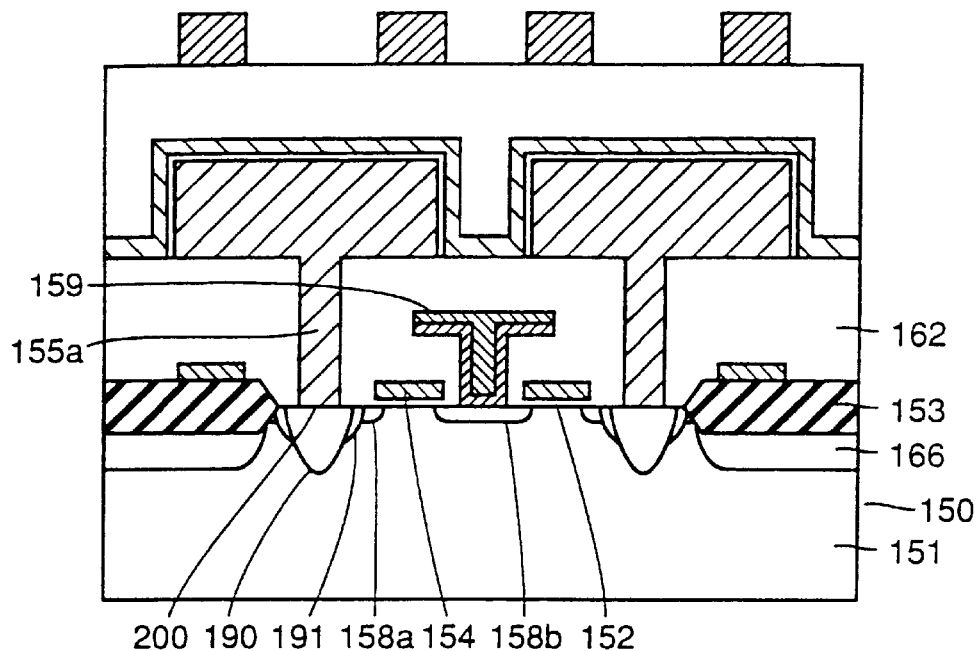
FIG. 10 is a view showing another cross section of the semiconductor device according to the third embodiment of the invention.
Figure 11:
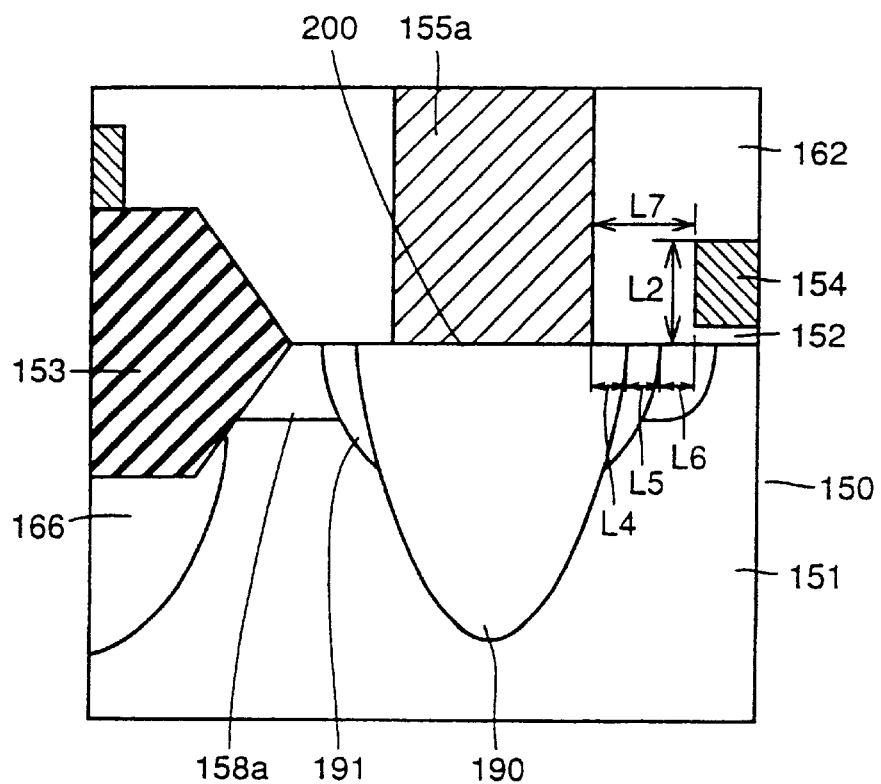
FIG. 11 is a view showing the cross section in FIG. 10 partially enlarged.

Note that as illustrated in FIG. 10, the same effect can be provided if $n^{++}$ impurity diffusion layer 190 is formed at a deeper level than $n^+$ impurity diffusion layer 191. As illustrated in FIG. 11, if distances L4, L5, and L6 are approximately the same, the above-described effect can further be enhanced.

According to the first to third embodiments, the capacitor is electrically connected to the columnar conductive layer. Therefore, leakage of charges from the capacitor to the semiconductor substrate can be prevented, and therefore, a semiconductor device with good storage characteristic can be provided.

Fourth Embodiment

Now, a semiconductor device according to a fourth embodiment of the invention will be described in conjunction with the accompanying drawings.

In the first to third embodiments, $n^+$ and/or $n^{++}$ impurity diffusion layer is provided in the vicinity of the region where the storage node of the capacitor is connected with the source/drain region of the MOS transistor. An $n^+$ and/or $n^{++}$ impurity diffusion layer may be provided in the vicinity of the source/drain region connected with a bit line rather than the storage node.

Figure 12:
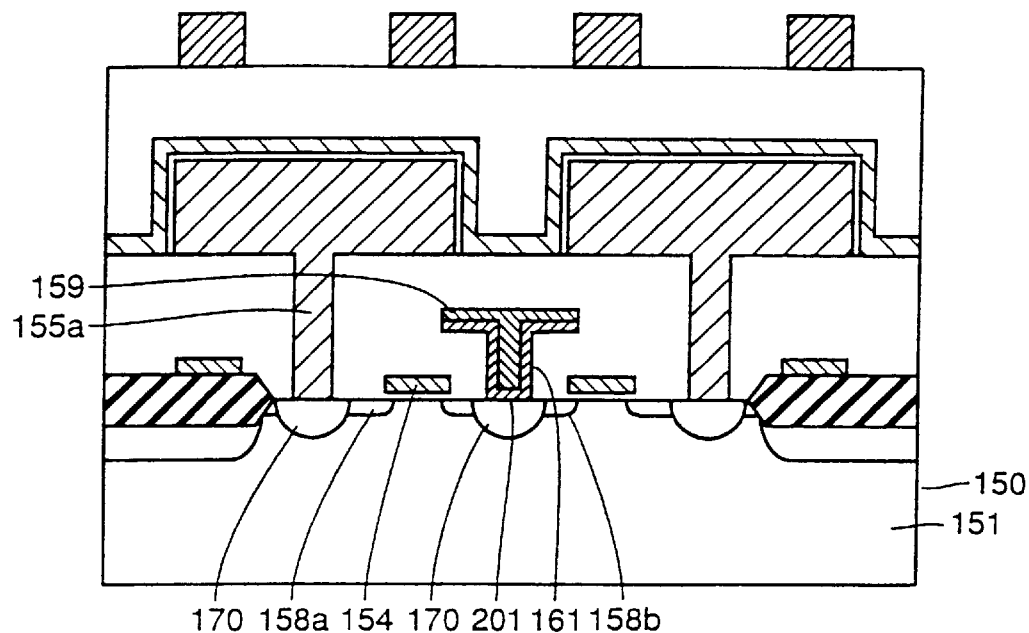
FIG. 12 is a view showing a cross section of a semiconductor device according to a fourth embodiment of the invention.

More specifically, referring to FIG. 12, the semiconductor device includes an $n^+$ impurity diffusion layer 170 in the vicinity of source/drain region 158b to which bit line 159 is electrically connected at contact portion 201. $N^+$ impurity diffusion layer 170 is formed by means of introducing an impurity from contact hole 161. Furthermore, as described in conjunction with the first embodiment referring to FIG. 2, the distance from $n^+$ impurity diffusion layer 170 including contact portion 201 to the region immediately below the side surface of gate electrode 154 is longer than the distance from semiconductor substrate 150 to the top surface of gate electrode 154. The distance may be different from the distance from $n^+$ impurity diffusion layer 170 connected electrically with storage node 150 to the region immediately below the side surface of gate electrode 154.

Also in this structure, the junction leakage current from bit line 159 to p type region 151 is restrained, and therefore, the electric field is relieved from contact portion 201 to the vicinity of the region immediately below the side surface of gate electrode 154. Therefore, a semiconductor device capable of more stable operation can be provided.

Fifth Embodiment

A semiconductor device according to a fifth embodiment of the invention will be described in conjunction with the accompanying drawings.

Figure 13:
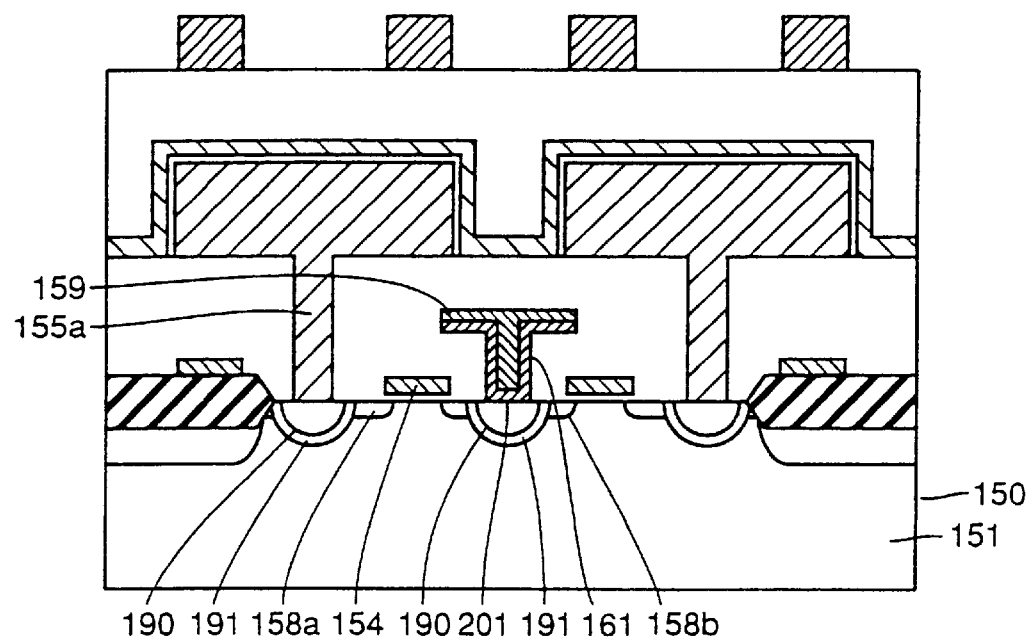
FIG. 13 is a view showing a cross section of a semiconductor device according to a fifth embodiment of the invention.
Figure 14:
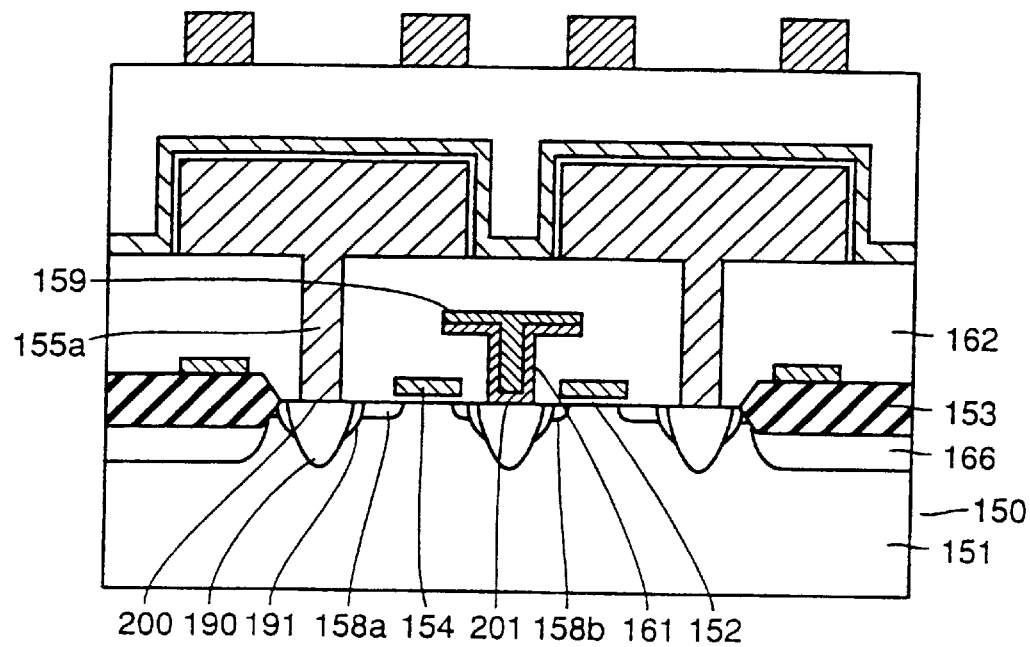
FIG. 14 is a view showing another cross section of a semiconductor device according to the fifth embodiment.

Referring to FIG. 13 or 14, the semiconductor device includes an $n^+$ impurity diffusion layer 191 and an $n^{++}$ impurity diffusion layer 190 to include contact portion 201. Also in this structure, the positional relation of $n^+$ impurity diffusion layer 191, $n^{++}$ impurity diffusion layer 190, and gate electrode 154 may be the same as that shown in FIG. 9 or FIG. 11.

In that case, the electric field is approximately uniformly relieved from contact portion 201 towards the vicinity of the region immediately below the side surface of gate electrode 154.

Figure 15:
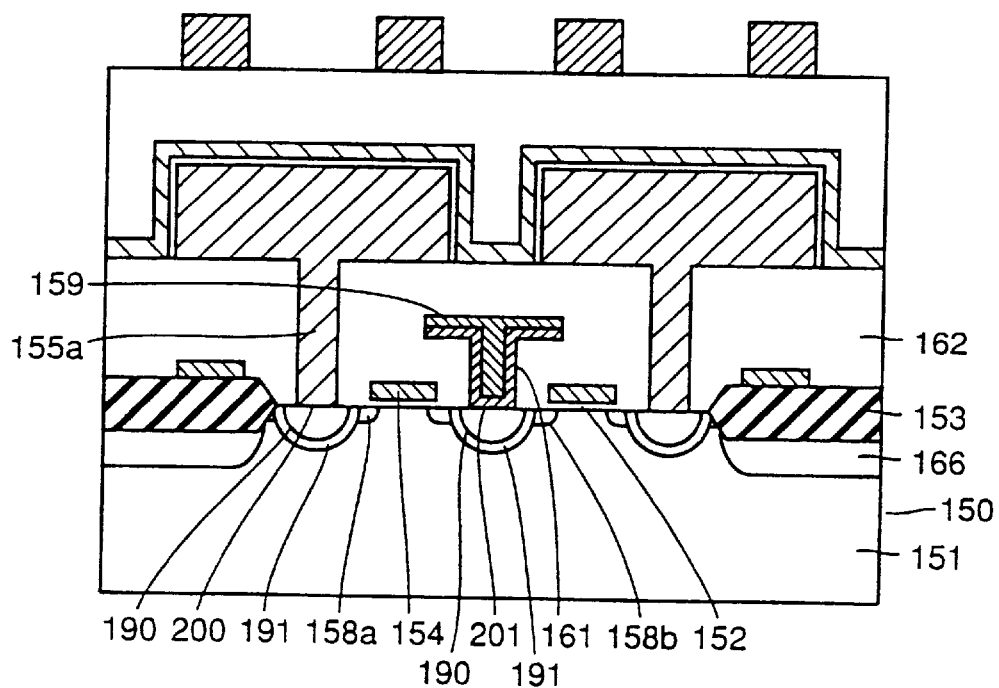
FIG. 15 is a view showing another cross section of the semiconductor device according to the fifth embodiment.
Figure 16:
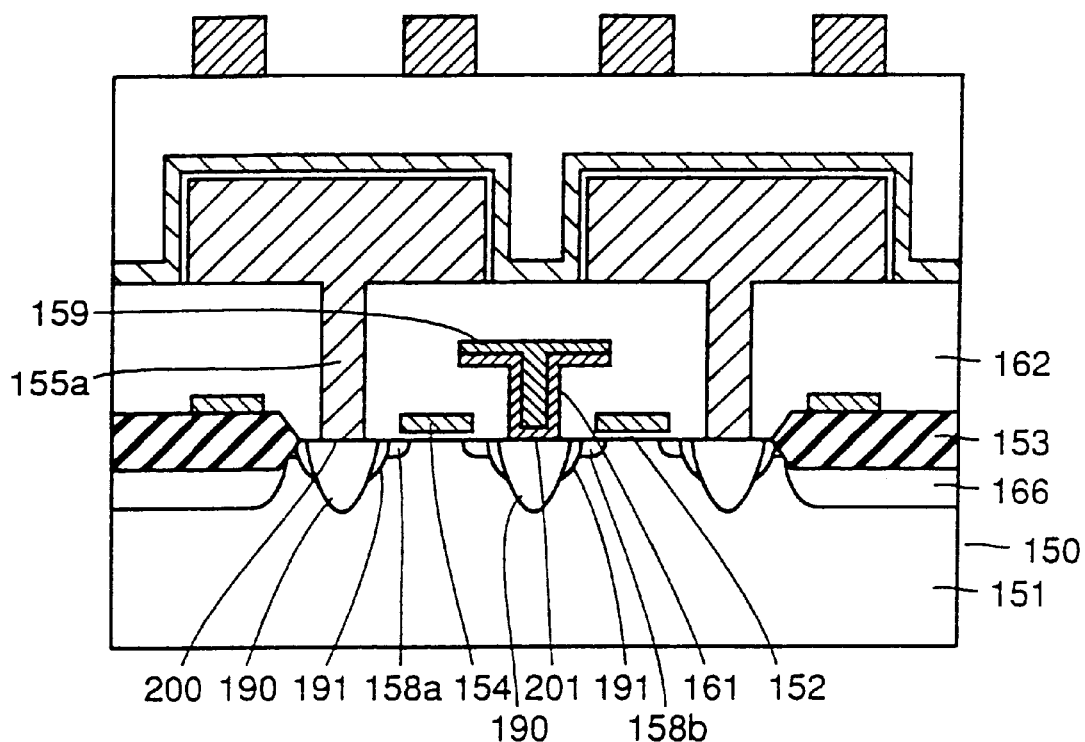
FIG. 16 is a view showing another cross section of the semiconductor device according to the fifth embodiment.

Furthermore, in semiconductor devices directed to high density integration, as illustrated in FIGS. 15 and 16, bit line contact 201 and gate electrode 154 come close to each other. In this case, the electric field can be relieved from contact portion 201 to the vicinity of the region immediately below the side surface of gate electrode 154 by the function of $n^+$ impurity diffusion layer 191 and $n^{++}$ impurity diffusion 190.

Therefore, a semiconductor device with good operation characteristic can be provided.

Sixth Embodiment

Now, a method of manufacturing a semiconductor device according to the first embodiment will be described as a sixth embodiment of the present invention.

Figure 17:
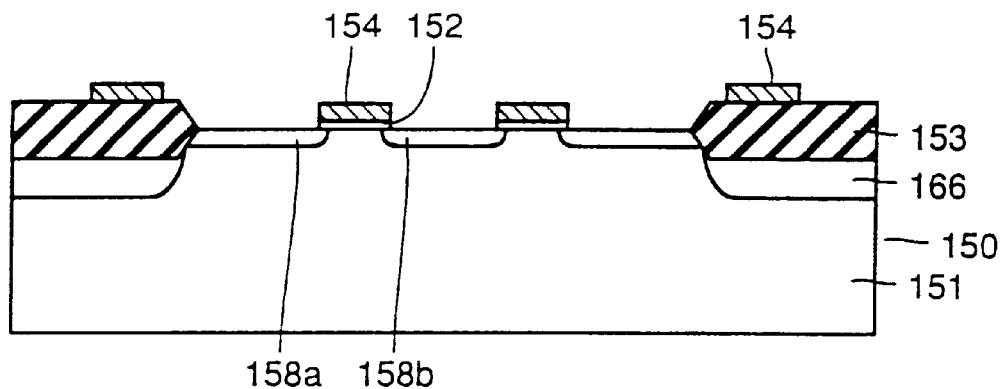
FIG. 17 is a cross section showing one process in a method of manufacturing a semiconductor device according to a sixth embodiment of the invention.
Figure 18:
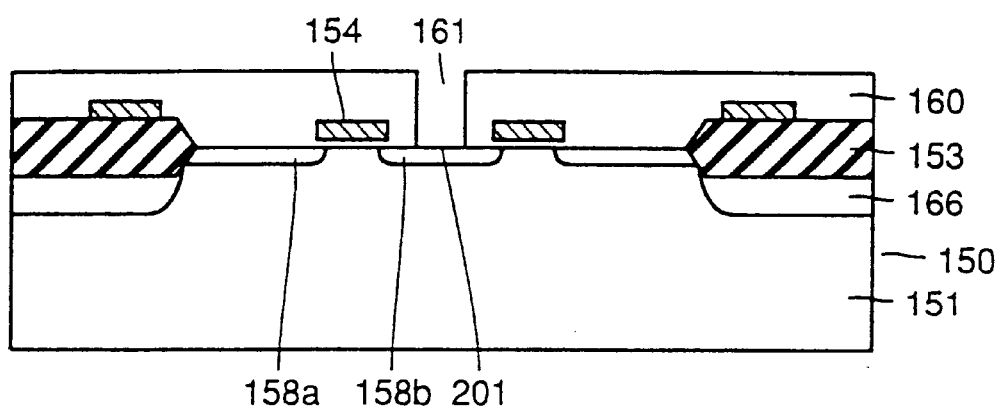
FIGS. 18 to 22 are cross sectional views successively showing processes following the process shown in FIG. 17 according to the sixth embodiment of the invention.
Figure 19:
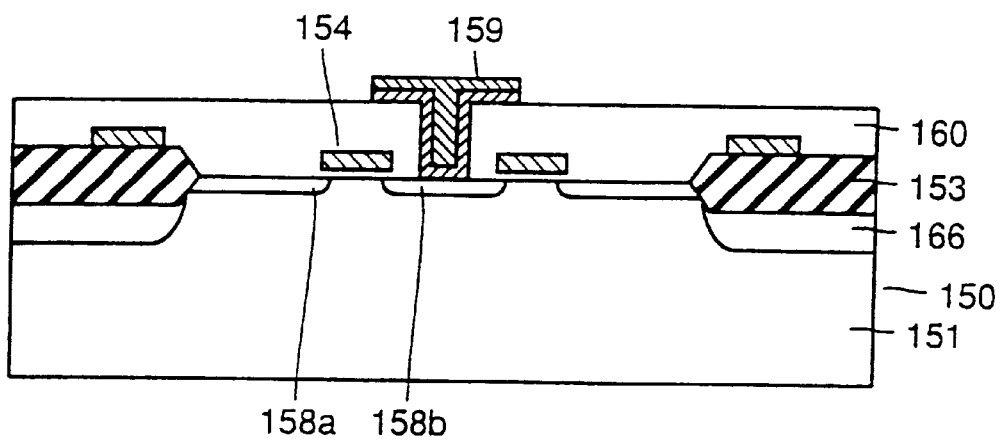
Figure 20:
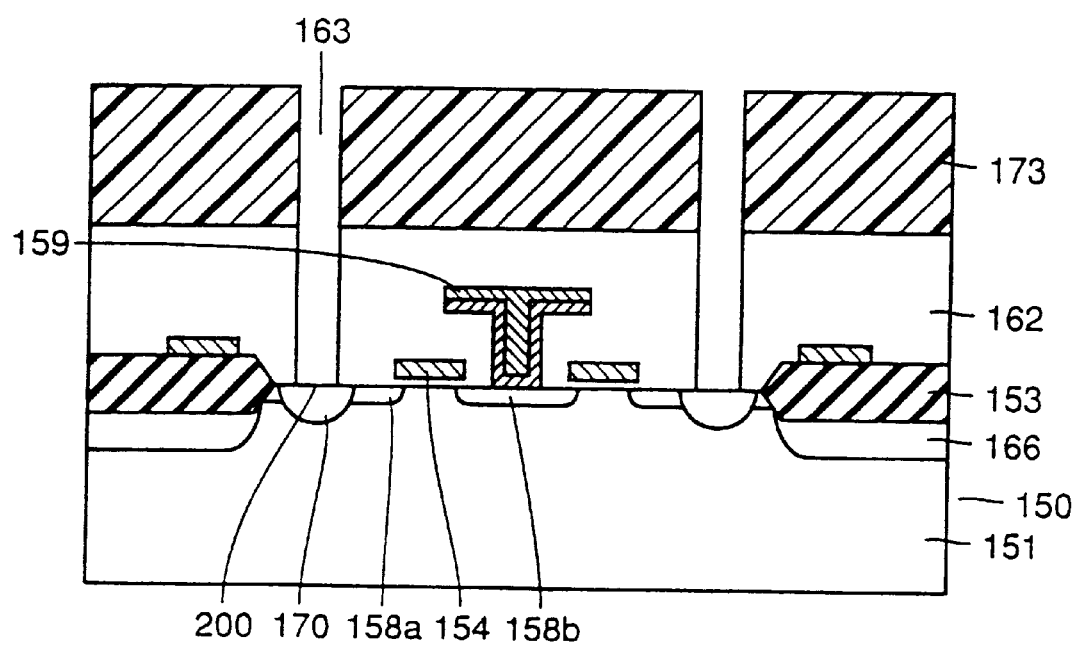
Figure 21:
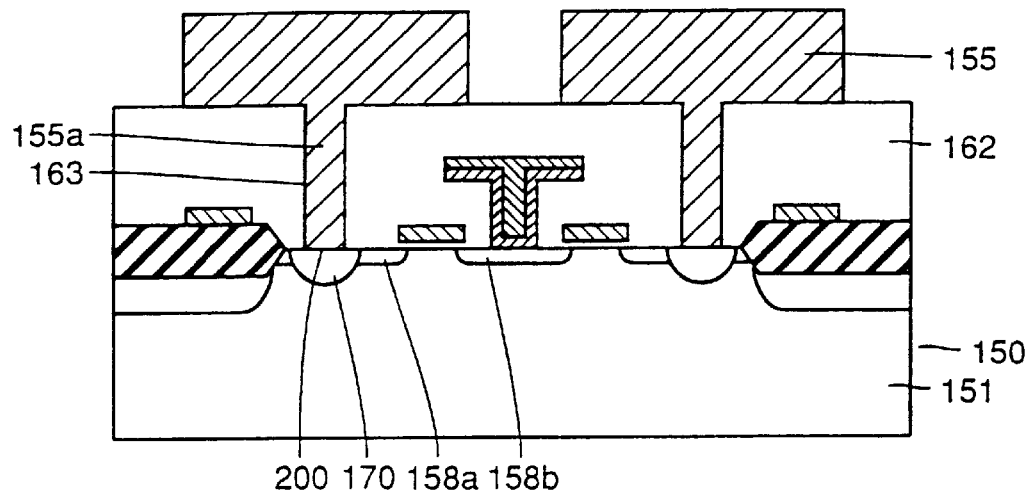
Figure 22:
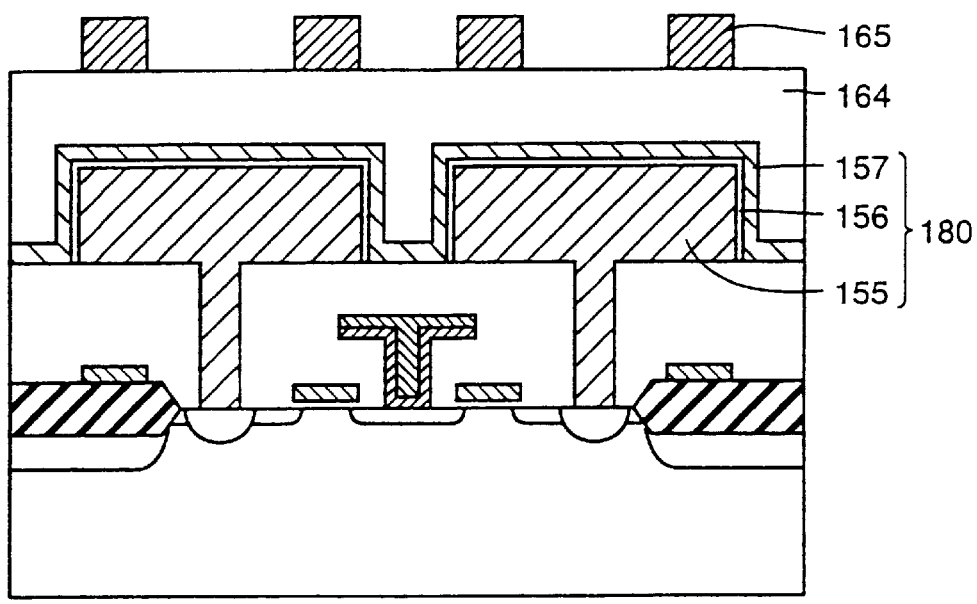

Referring to FIG. 17, a p type impurity region 166 and a field insulating film 153 for isolating elements are formed in the p type region 151 of semiconductor substrate 150. After forming a gate electrode 154 with a gate insulting film 152 interposed therebetween, using gate electrode 154 and field insulating film 153 as mask, phosphorous ions are implanted in a dose of $5 \times 10^{12}$–$5 \times 10^{13}$ atoms/cm$^2$, with an energy in the range from 10–30 KeV to form a pair of n type source/drain regions 158a, and 158b having an impurity concentration in the range from $10^{16}$–$10^{19}$ atoms/cm$^3$. Now, referring to FIG. 18, an interlayer insulating film 160 is formed on semiconductor substrate 150 including gate electrode 154. A bit line contact hole 161 is formed in interlayer insulating film 160 by means of a prescribed photolithography process, so as to expose contact portion 201. Referring to FIG. 19, a bit line 159 having a polycide structure formed of polysilicon and silicide is formed so as to fill contact hole 161. Referring to FIG. 20, interlayer insulating film 162 is formed so as to cover bit line 159. Photoresist 173 is formed by means of a prescribed photolithography process, and then anisotropic etching is conducted to form a contact hole 163 which exposes contact portion 200 including part of the surface of n type source/drain region 158a. Phosphorous ions in a dose in the range of $3 \times 10^{13}$–$5 \times 10^{14}$ atoms/cm$^2$ with an energy in the range from 50–200 KeV are implanted through contact hole 163 and an n$^+$ impurity diffusion layer 170 having an impurity concentration in the range from $10^{17}$–$10^{20}$ atoms/cm$^3$ is formed. Photoresist 173 is removed. Then, referring to FIG. 21, a storage node 155 to be connected with contact portion 200 through columnar conductive layer 155a which fills contact hole 163 is formed. Referring to FIG. 22, a cell plate 157 is formed on storage node 155 with a capacitor insulating film 156 therebetween to form a capacitor 180. An interlayer insulating film 164 is formed to cover capacitor 180. A metal interconnection 165 such as of aluminum is formed on interlayer insulating film 164. Through the above-described processes, the semiconductor device shown in FIG. 1 is formed.

Note that the conditions of implantation for forming n$^+$ impurity diffusion layer 170 may be different if the structure shown in FIG. 2 is eventually formed by thermal treatment of the implantation region in a series of manufacturing processes.

Seventh Embodiment

Another method of manufacturing a semiconductor device according to the first embodiment of the invention will be described as a seventh embodiment.

Figure 23:
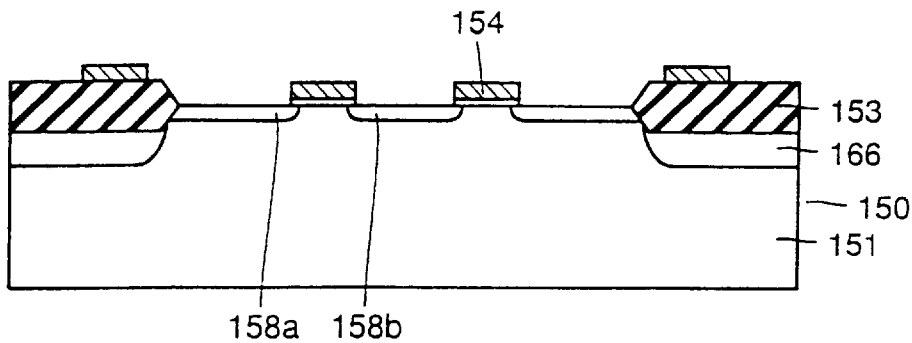
FIG. 23 is a cross sectional view showing one process in a method of manufacturing a semiconductor device according to a seventh embodiment.
Figure 24:
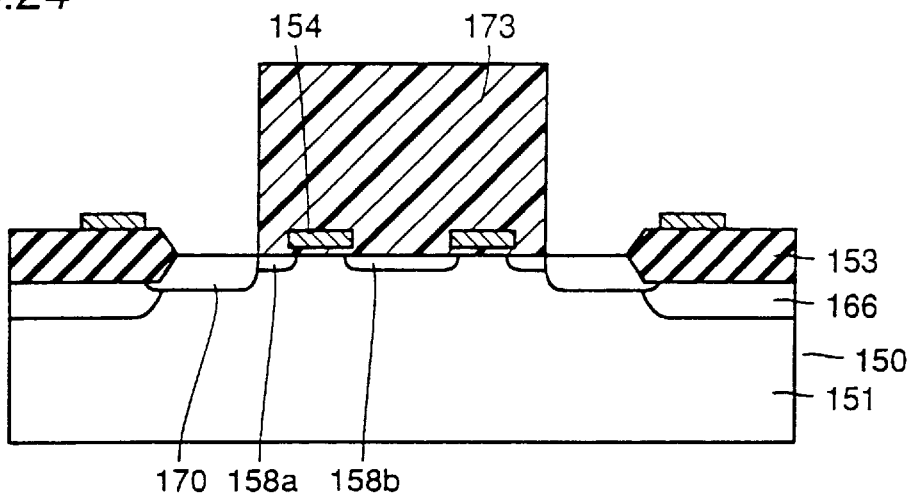
FIGS. 24 to 27 are cross sectional views successively showing processes following the process shown in FIG. 23 according to the seventh embodiment of the invention.
Figure 25:
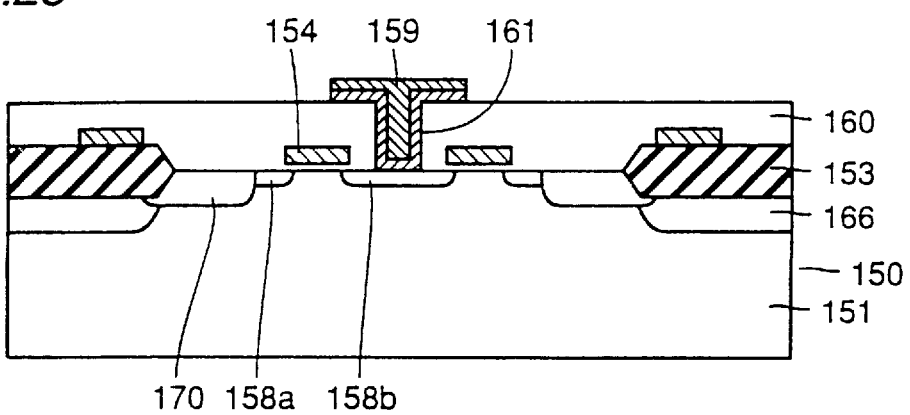
Figure 26:
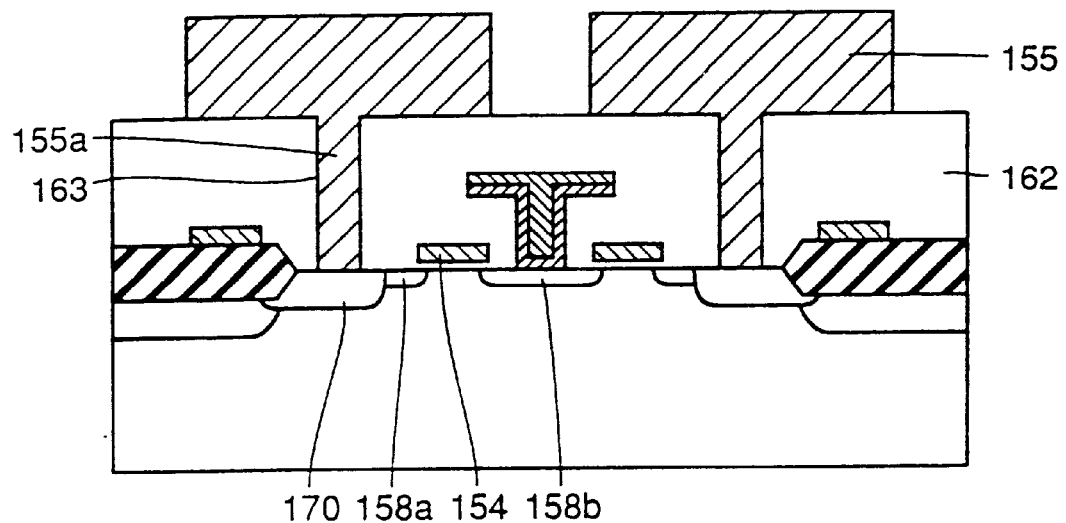
Figure 27:
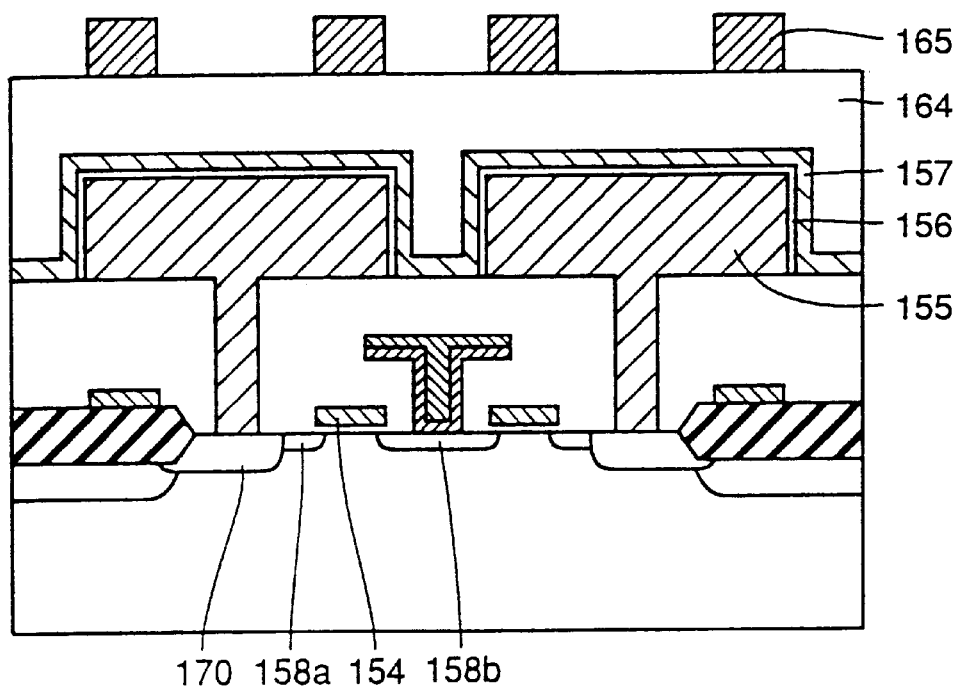

The manufacturing processes till the process shown in FIG. 23 are entirely the same as the sixth embodiment. Then, referring to FIG. 24, photoresist 173 is formed in a prescribed region including gate electrode 154. Using photoresist 173 as mask, phosphorous ions are implanted to form an n$^+$ impurity diffusion layer 170. The distance between the side surface of photoresist 173 and the side surface of gate electrode 154 on the side of photoresist 173 is preferably sufficiently longer than the distance from the surface of the semiconductor substrate to the top surface of gate electrode 154. Now, referring to FIG. 25, an interlayer insulating film 160, and a bit line 159 are formed. Referring to FIG. 26, a columnar conductive layer 155a is formed in contact hole 163 formed in interlayer insulating film 162. A storage node 155 to be electrically connected with columnar conductive layer 155a is formed. Referring to FIG. 27, a capacitor insulating film 156, a cell plate 157, an interlayer insulating film 164, and a metal interconnection 165 are formed. The n$^+$ impurity diffusion layer 170 of the semiconductor device formed through the above-described processes is formed by means of ion implantation using the prescribed patterned resist described above as mask, and therefore, the positional relation shown in FIG. 2 is established.

Eighth Embodiment

A method of manufacturing the semiconductor device according to the second embodiment will be described as an eighth embodiment of the invention.

Figure 28:
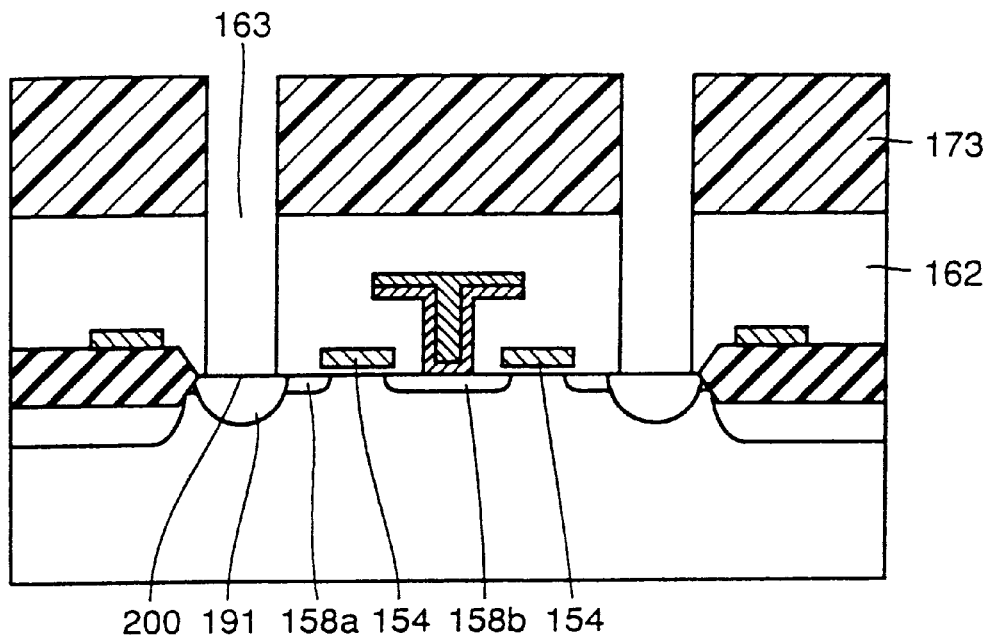
FIG. 28 is a cross sectional view showing one process in a method of manufacturing a semiconductor device according to an eighth embodiment of the invention.
Figure 29:
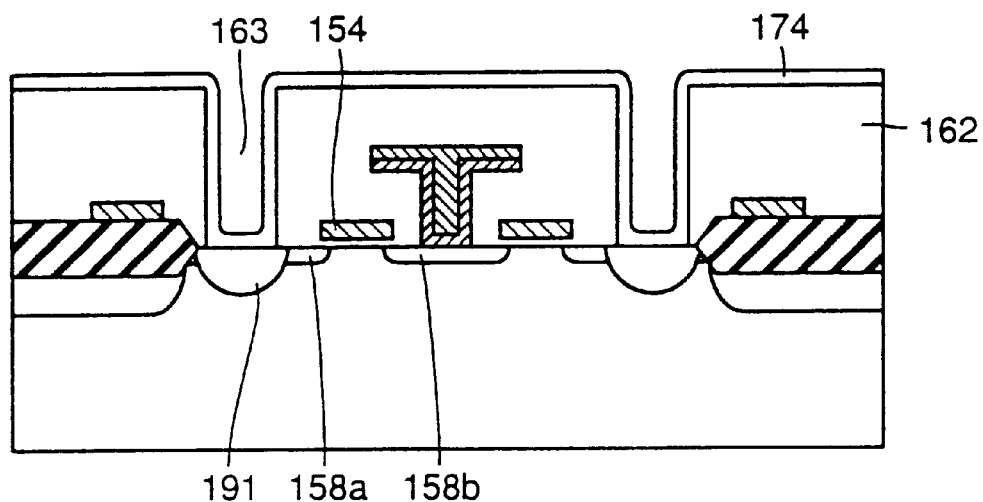
FIGS. 29 to 31 are cross sectional views successively showing processes following the process in FIG. 28 according to the eighth embodiment of the invention.
Figure 30:
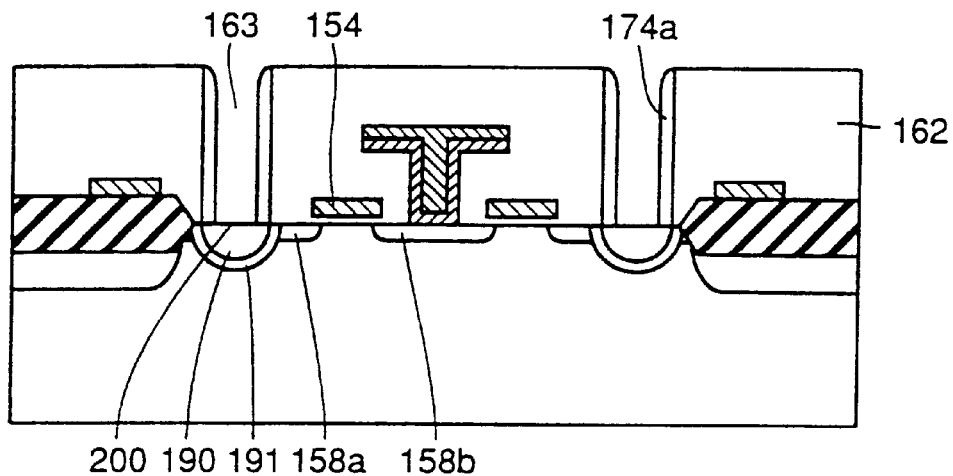
Figure 31:
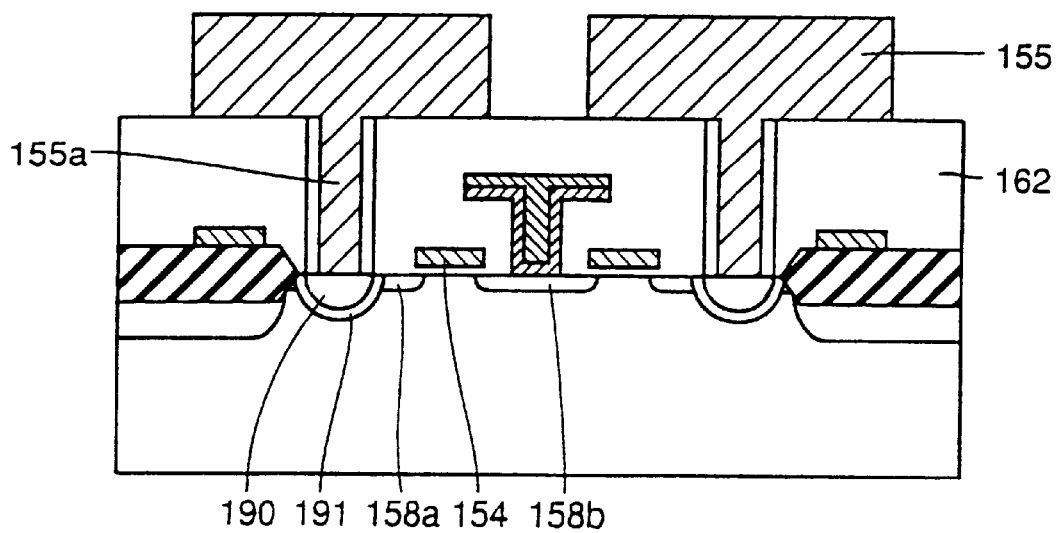

Referring to FIG. 28, the processes until opening contact hole 163 for storage node are entirely the same as the sixth embodiment, with difference being that the diameter of the hole is larger than the sixth embodiment. Phosphorous ions are implanted through contact hole 163 to form an n$^+$ impurity diffusion layer 191. Referring to FIG. 29, a silicon oxide film 174 is formed on interlayer insulating film 162 including the side surface of contact hole 163. Now, referring to FIG. 30, the silicon oxide film is anisotropically etched to form a side wall 174a on the side surface of contact hole 163. Thereafter, arsenic ions are implanted through contact hole 163 to form an n$^{++}$ impurity diffusion layer 190. Referring to FIG. 31, a columnar conductive layer 155a is formed in contact hole 163, and then a storage node 155 to be electrically connected to columnar conductive layer 155a is formed. Then, forming a cell plate, a metal interconnection or the like completes the semiconductor device shown in FIG. 4.

Note that in this embodiment, although n$^{++}$ impurity diffusion layer 190 is formed by means of ion implantation, the process of doping an impurity may be employed. For example, referring to FIG. 31, columnar conductive layer 155a may be doped with an n type impurity, phosphorus in a concentration in the range from $1 \times 10^{20}$–$1 \times 10^{21}$ atoms/cm$^3$. Then, the semiconductor substrate is thermally treated at a temperature in the range from 800° C. to 900° C. for 30 minutes or more, and phosphorous columnar conductive layer 155a diffuses from contact portion 200 to n$^+$ impurity diffusion layer 191. Thus, the diffused phosphorus forms an n$^{++}$ impurity diffusion layer 190 having a concentration in the range of $10^{18}$–$10^{21}$ atoms/cm$^3$.

Ninth Embodiment

Now, a method of manufacturing a semiconductor device shown in FIG. 6 will be described as a ninth embodiment of the invention.

Figure 32:
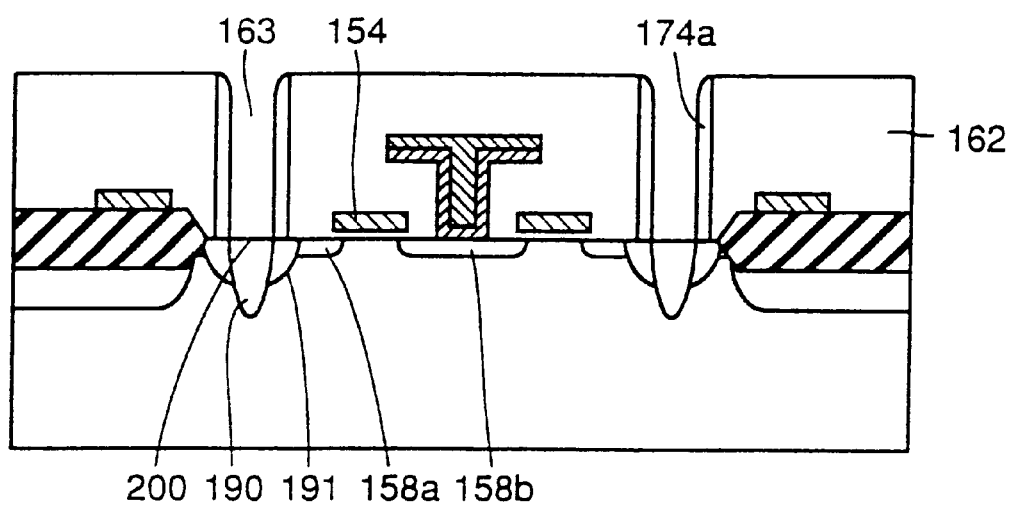
FIG. 32 is a cross sectional view showing one process in a method of manufacturing a semiconductor device according to a ninth embodiment of the invention.

Referring to FIG. 32, the processes until opening contact hole 163 are entirely the same as the processes described in conjunction with the eighth embodiment. Then, arsenic ions are implanted from contact hole 163 to form an n$^{++}$ impurity diffusion layer 190. At the time the implantation energy of arsenic ions is set higher than the energy in the case of the eighth embodiment so that n$^{++}$ impurity diffusion layer 190 is formed at a deeper level than n$^+$ impurity diffusion layer 191. Then, forming a capacitor, a metal interconnection or the like completes the semiconductor device shown in FIG. 6.

Note that n$^+$ impurity diffusion layer 191 and n$^{++}$ impurity diffusion layer 190 described in conjunction with the eighth embodiment and the ninth embodiment eventually attain the structures shown in FIGS. 7 and 2, respectively through thermal treatment in the series of manufacturing process.

Tenth Embodiment

The manufacturing methods described in conjunction with the sixth to ninth embodiments may be applied to the semiconductor device directed to high density integration according to the third embodiment. More specifically, phosphorous ions or arsenic ions in a prescribed dose may be implanted with a prescribed implantation energy to form an $n^+$ impurity diffusion layer and an $n^{++}$ impurity diffusion layer, and then the structure shown in FIG. 8 or FIG. 11 is eventually formed.

According to the manufacturing methods described in conjunction with the sixth to ninth embodiment, prescribed ions may be implanted through a bit line contact hole to form such a structure having an $n^+$ impurity diffusion layer and an $n^{++}$ impurity diffusion layer in the vicinity of a source/drain region to which the bit line is connected.

Although the phosphorous ions are implanted in the sixth to ninth embodiments, nitrogen or silicide ions may be implanted rather than phosphorous ions. Although an n channel MOS transistor formed in a p type region of a semiconductor substrate has been described in conjunction with the first to tenth embodiment, the invention may be applied to a p channel MOS transistor formed in an n type region of a semiconductor substrate, and the same effects can be provided.

Eleventh Embodiment

Figure 33:
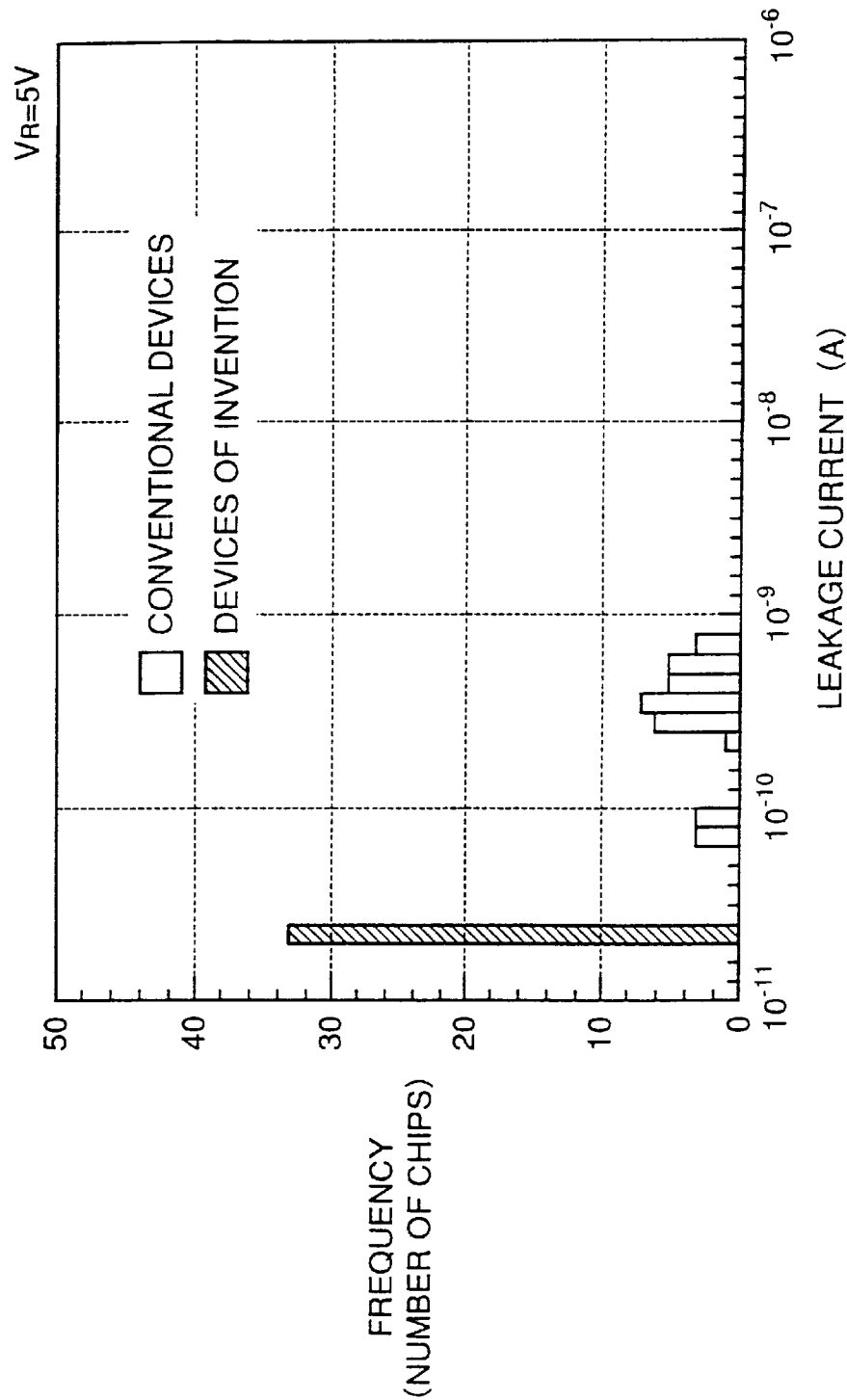
FIG. 33 is a graph showing the result of measuring leakage current in the semiconductor device according to an eleventh embodiment of the invention.
Figure 34:
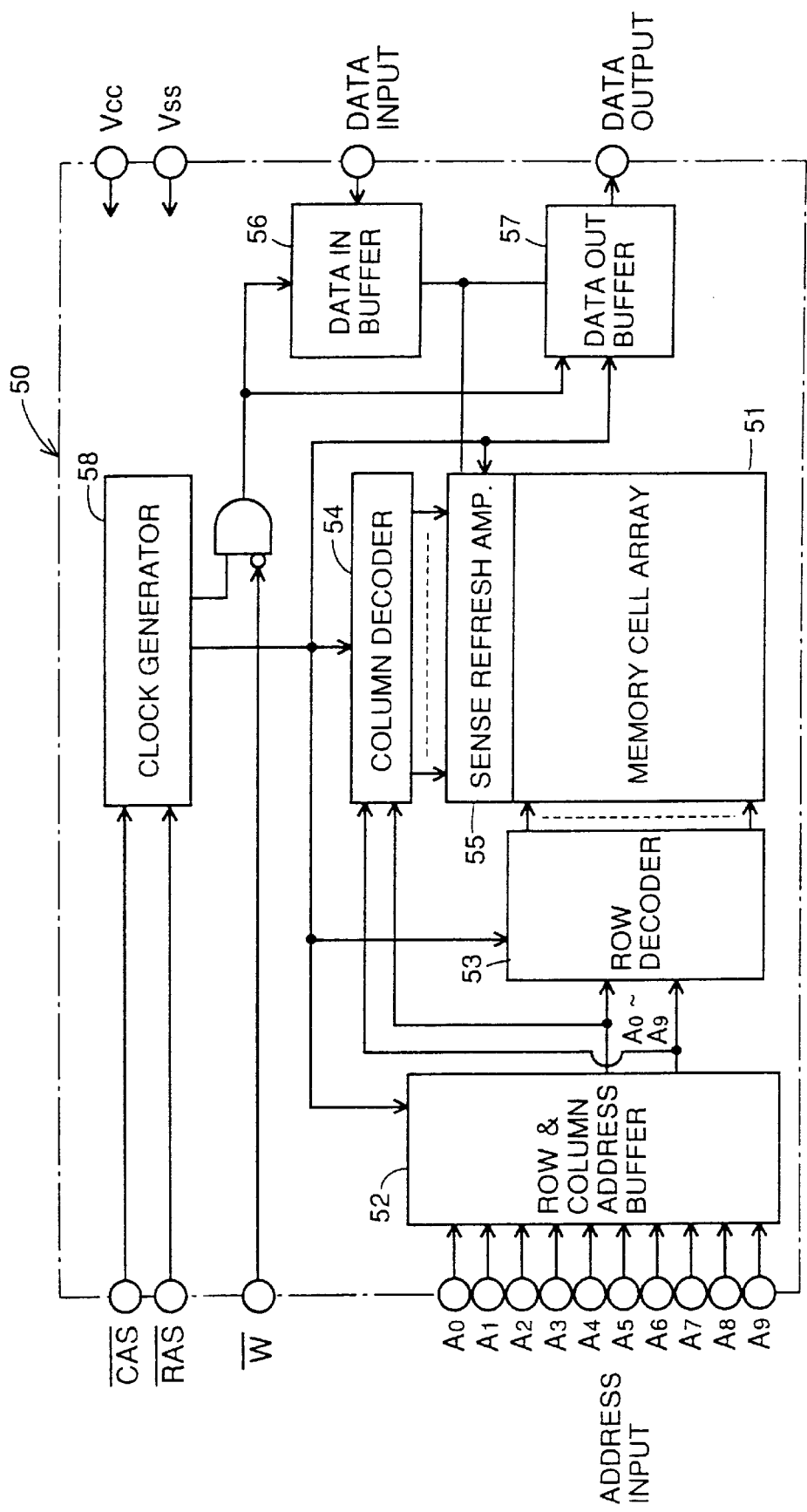
FIG. 34 is block diagram showing a conventional DRAM.
Figure 35:
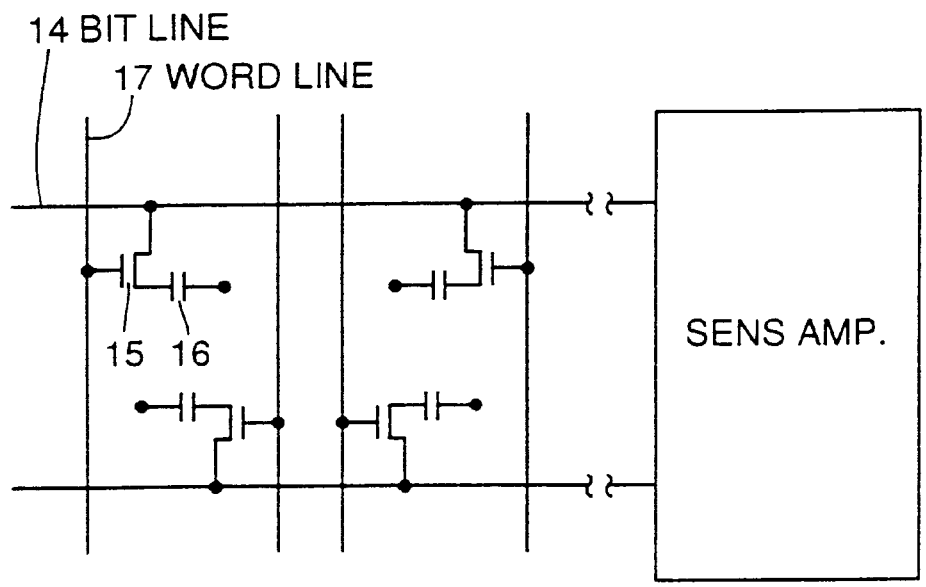
FIG. 35 is an equivalent circuit diagram showing a memory cell in a conventional DRAM.
Figure 36:
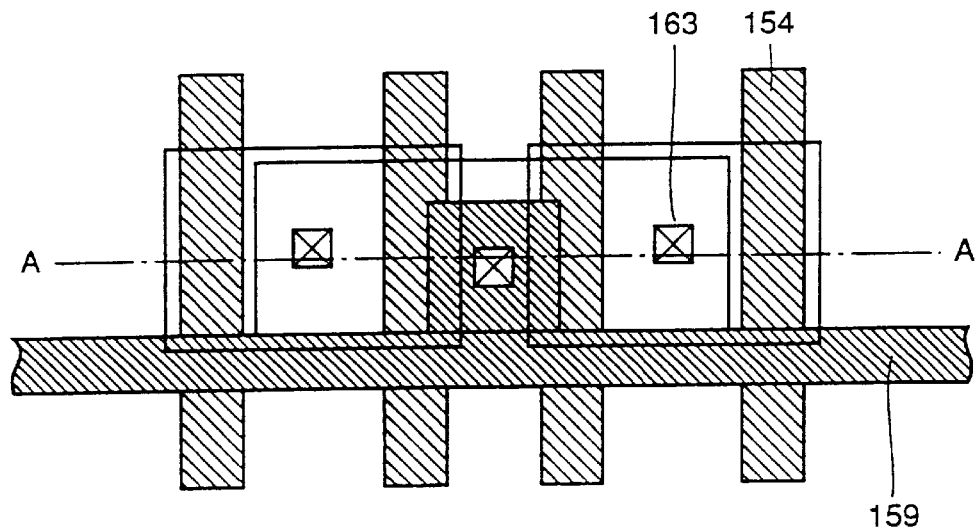
FIG. 36 is a plan view showing a memory cell portion in a conventional DRAM.
Figure 37:
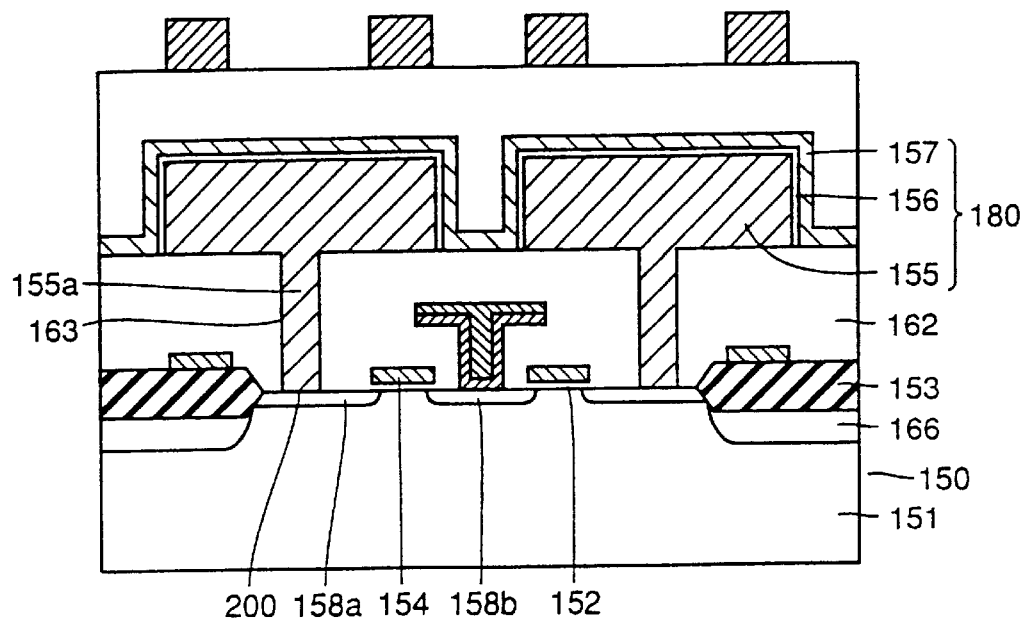
FIG. 37 is a cross sectional views taken along line A—A in FIG. 35 showing the memory cell portion in the conventional DRAM.
Figure 38:
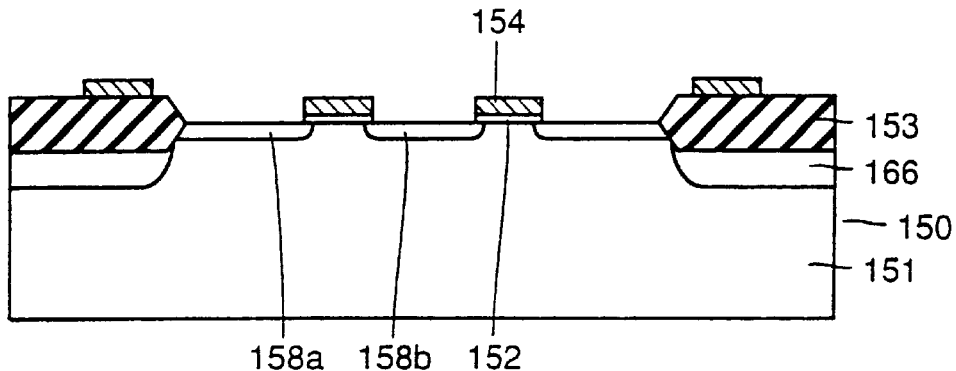
FIG. 38 is a cross sectional view showing one process in a method of manufacturing a conventional DRAM.
Figure 39:
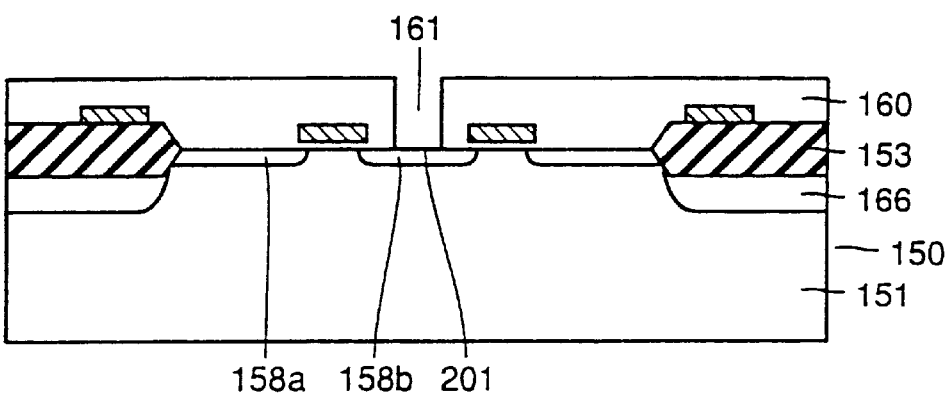
FIGS. 39 to 43 are cross sectional views successively showing processes following the process shown in FIG. 38.
Figure 40:
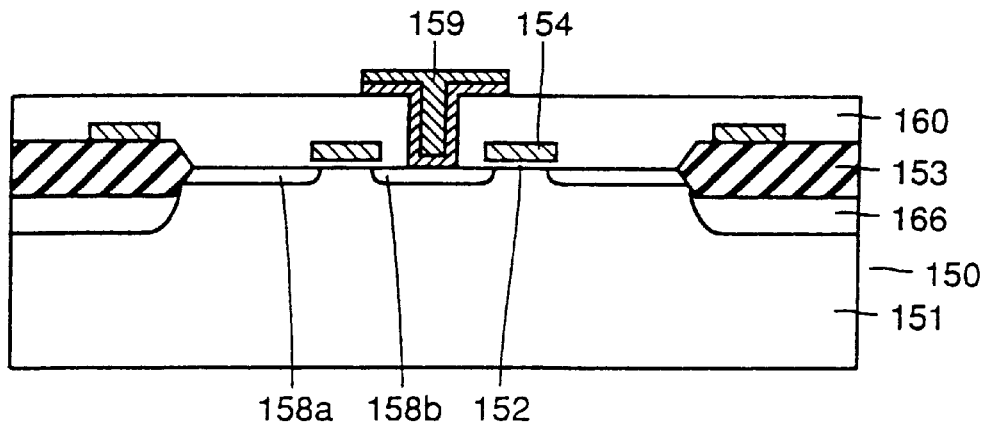
Figure 41:
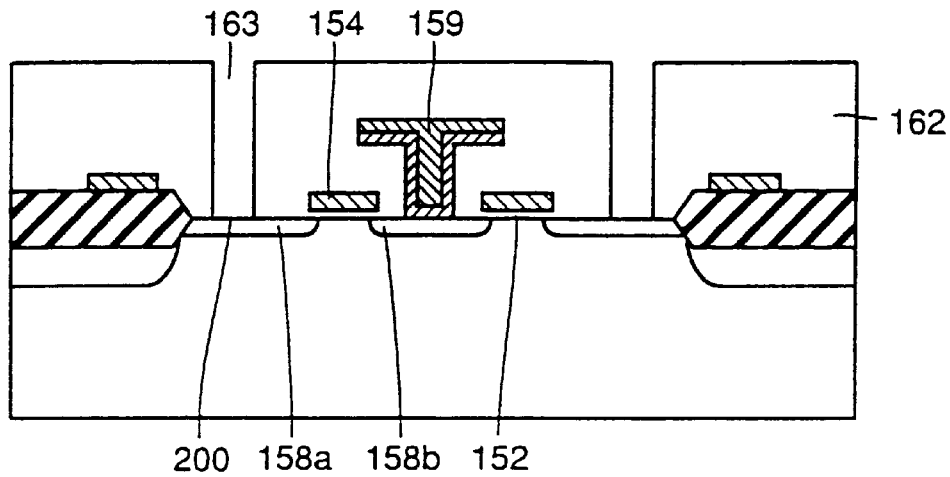
Figure 42:
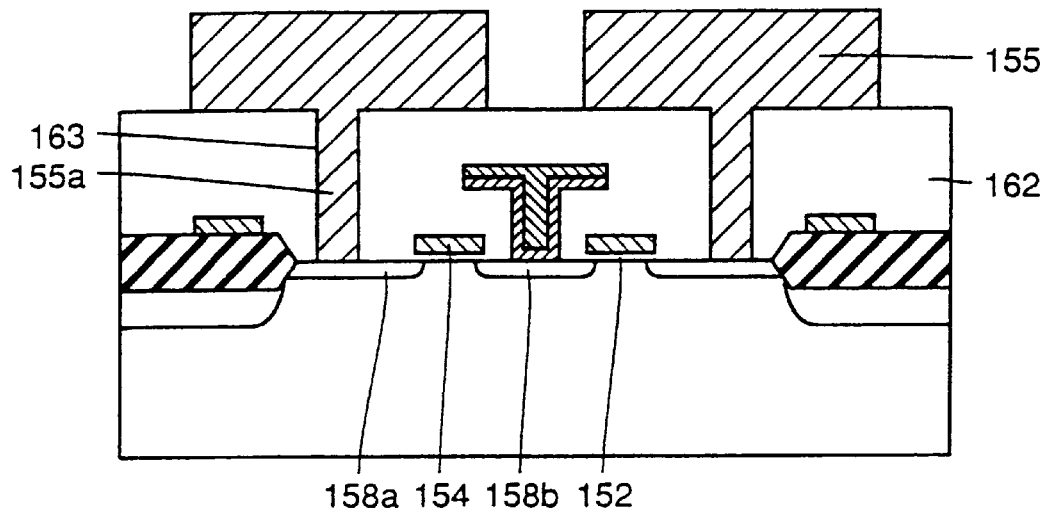
Figure 43:
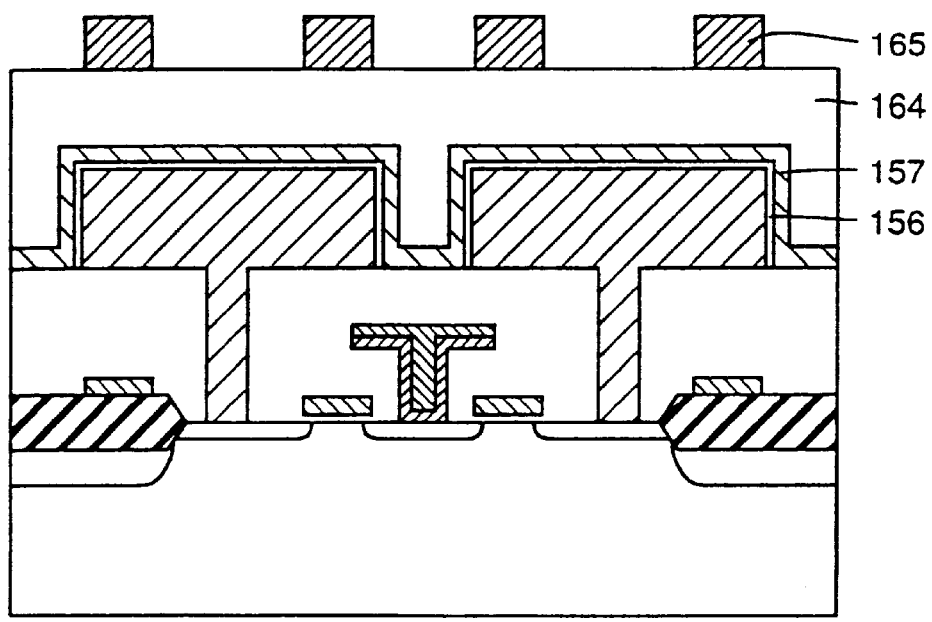
Figure 44:
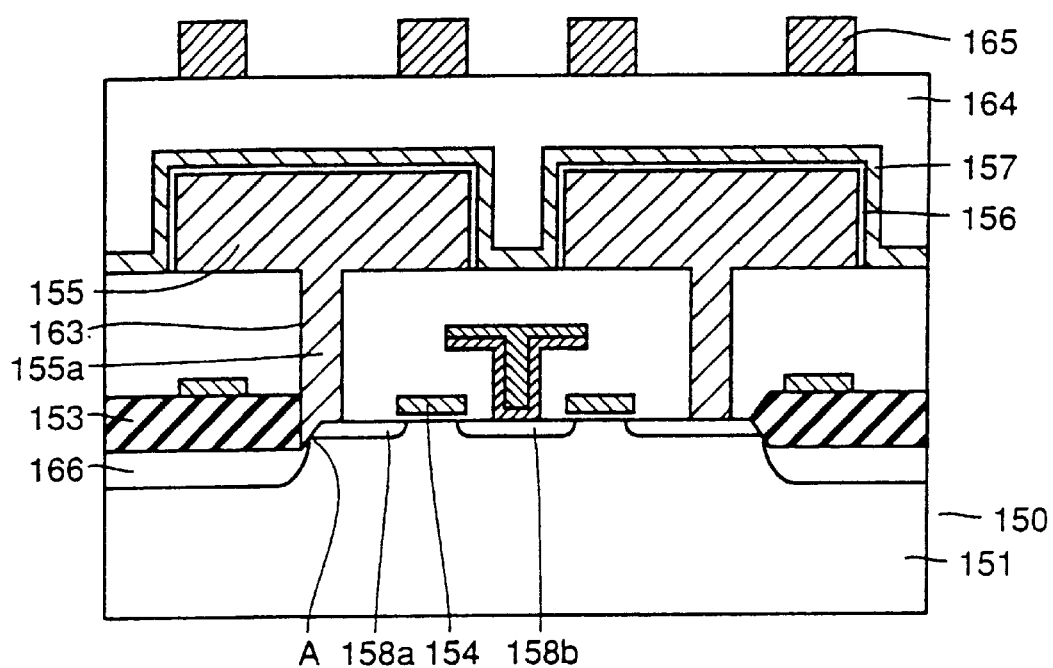
FIG. 44 is a cross sectional view showing a memory cell portion in a conventional DRAM.

Finally, the leakage current of the semiconductor device having the structure described in conjunction with the first or second embodiment was measured. FIG. 33 sets forth the result. Referring to FIG. 33, difference in the leakage current of the semiconductor device according to the present invention was determined to be smaller than that of conventional semiconductor devices.

Note that the embodiments disclosed herein are only examples, and it is intended that various forms of embodiments may be employed within the scope of equivalence of the invention recited in the scope of claims.

What is claimed is:

1. A semiconductor device, comprising:
    a region of first type conductivity formed on a main surface of a semiconductor substrate;
    a pair of first impurity regions of second type conductivity formed a prescribed space apart from each other in said region of first type conductivity;
    a gate electrode formed on said region of first type conductivity between said pair of first impurity regions with a first insulating film therebetween;
    a second insulating film formed on said main surface so as to cover said gate electrode;
    a contact hole formed in said second insulating film so as to expose a contact portion including part of the surface of at least one region of said pair of first impurity regions;
    a conductive layer formed to fill said contact hole and electrically connected with said one region at said contact portion; and
    a second impurity region of the second type conductivity formed only in one of said pair of first impurity regions to include said contact portion, wherein
        said second impurity region has a concentration of the impurity of said second type conductivity higher than that of said first impurity region and formed at a level deeper than said one region, and
        the distance on said main surface from said second impurity region to a region immediately below a side surface of said gate electrode on the side of said second impurity region is longer than the distance from said main surface to the top surface of said gate electrode.

2. The semiconductor device as recited in claim 1, wherein
    the impurity concentration of said second impurity region is in the range from $10^{17}$ to $10^{20}$ atoms/cm$^3$.

3. The semiconductor device as recited in claim 1, wherein
    said conductive layer is electrically connected with a capacitor or a bit line.

4. The semiconductor device as recited in claim 1, further comprising a third impurity region of the second type conductivity formed in said one region and surrounding said second impurity region on said main surface,
    said third impurity region having a concentration of impurity of the second type conductivity higher than that of said first impurity region and lower than that of said second impurity region,
    said second impurity region, said third impurity region, and said one region being positioned in this order from said contact portion toward said gate electrode on said main surface.

5. The semiconductor device as recited in claim 4, wherein
    the impurity concentration of said second impurity region is in the range from $10^{18}$ to $10^{21}$ atoms/cm$^3$, and the impurity concentration of said third impurity region is in the range from $10^{17}$ to $10^{20}$ atoms/cm$^3$.

6. The semiconductor device as recited in claim 4, wherein
    said conductive layer is electrically connected with a capacitor or a bit line.

7. The semiconductor device as recited in claim 4, wherein
    the distance on said main surface from said third impurity region to a region immediately below the side surface of said gate electrode on the side of said third impurity region is approximately half the distance on said main surface from said second impurity region to the region immediately below said side surface.

8. A semiconductor device, comprising:
    a region of first type conductivity formed on a main surface of a semiconductor substrate;
    a pair of first impurity regions of second type conductivity formed a prescribed space apart from each other in said region of first type conductivity;
    a gate electrode formed on said region of first type conductivity between said pair of first impurity regions with a first insulating film therebetween;
    a second insulating film formed on said main surface so as to cover said gate electrode;
    a contact hole formed in said second insulating film so as to expose a contact portion including part of the surface of at least one region of said pair of first impurity regions;
    a conductive layer formed to fill said contact hole and electrically connected with said one region at said contact portion;
    a second impurity region of the second type conductivity formed only in one of said pair of first impurity regions to include said contact portion; and
    a third impurity region of the second type conductivity formed only in one of said pair of first impurity regions to include said contact portion and surrounding said second impurity region on said main surface,
        said second impurity region having a concentration of impurity of the second type conductivity higher than that of said first impurity region and being formed at a level deeper than said one region, said third impurity region having a concentration of impurity of the second type conductivity higher than that of said first impurity region and lower than said second impurity region, the distance on said main surface from said contact portion to a region immediately below a side surface of said gate electrode on the side of said contact portion being longer than the distance from said main surface to the top surface of said gate electrode;

said second impurity region, said third impurity region and said one region being positioned in this order from said contact portion toward said gate electrode on said main surface.

9. The semiconductor devices as recited in claim 8, wherein the impurity concentration of said second impurity region is in the range from $10^{18}$ to $10^{21}$ atoms/cm$^3$, and the impurity concentration of said third impurity region is in the range from $10^{17}$ to $10^{20}$ atoms/cm$^3$.

10. The semiconductor devices as recited in claim 8, wherein said conductive layer is electrically connected with a capacitor or a bit line.

11. The semiconductor device as recited in claim 8, wherein on said main surface, in the direction from said contact portion to said gate electrode, the distance from said contact portion to said third impurity region, the distance from said second impurity region to said one region, and the distance from said third impurity region to the region immediately below the side surface of said gate electrode are approximately the same.

12. A semiconductor device comprising:

a region of first type conductivity formed on a main surface of a semiconductor substrate;

a pair of first impurity regions of second type conductivity formed a prescribed space apart from each other in said region of first type conductivity;

a gate electrode formed on said region of first type conductivity between said pair of first impurity regions with a first insulating film therebetween;

a second insulating film formed on said main surface so as to cover said gate electrode;

a contact hole formed in said second insulating film so as to expose a contact portion including part of the surface of at least one region of said pair of first impurity regions;

a conductive layer formed to fill said contact hole and electrically connected with said one region at said contact portion; and a second impurity region of the second type conductivity formed only in one of said pair of first impurity regions to include said contact portion, wherein said second impurity region is formed by introducing an impurity from the contact hole through the contact portion and said second impurity region has a concentration of the impurity of said second type conductivity higher than that of said first impurity region and formed at a level deeper than said one region.

13. A semiconductor device, comprising:

a region of first type conductivity formed on a main surface of a semiconductor substrate;

a pair of first impurity regions of second type conductivity formed a prescribed space apart from each other in said region of first type conductivity;

a gate electrode formed on said region of first type conductivity between said pair of first impurity regions with a first insulating film therebetween;

a second insulating film formed on said main surface so as to cover said gate electrode;

a contact hole formed in said second insulating film so as to expose a contact portion including part of the surface of at least one region of said pair of first impurity regions;

a conductive layer formed to fill said contact hole and electrically connected with said one region at said contact portion; a second impurity region of the second type conductivity formed only in one of said pair of first impurity regions to include said contact portion; and a third impurity region of the second type conductivity formed only in one of said pair of first impurity regions to include said contact portion and surrounding said second impurity region on said main surface, wherein:

said second impurity region is formed by introducing an impurity from the contact hole through the contact portion and said second impurity region has a concentration of impurity of the second type conductivity higher than that of said first impurity region and being formed at a level deeper than said one region;

said third impurity region is formed by introducing an impurity from the contact hole through the contact portion and said third impurity region has a concentration of impurity of the second type conductivity higher than that of said first impurity region and lower than said second impurity region; and said second impurity region, said third impurity region and said one region being positioned in this order from said contact portion toward said gate electrode on said main surface.

* * * * *